United States Patent [19]

Strasser

[11] Patent Number: 4,887,027
[45] Date of Patent: Dec. 12, 1989

[54] LEADLESS CURRENT-SENSING SYSTEM

[76] Inventor: Gene W. Strasser, 2887 Walmsley Cir., Lake Orion, Mich. 48035

[21] Appl. No.: 282,037

[22] Filed: Dec. 9, 1988

[51] Int. Cl.[4] ................ G01R 33/06; G01R 33/00
[52] U.S. Cl. .................... 324/117 H; 324/117 R; 324/127; 324/252
[58] Field of Search ............... 324/117 R, 117 H, 251, 324/252, 127; 364/483; 307/309; 338/32 R

[56] References Cited

U.S. PATENT DOCUMENTS

| | | | |
|---|---|---|---|
| 4,053,829 | 10/1977 | Maruo | 324/252 |
| 4,296,377 | 10/1981 | Ohkubo | 324/252 |

Primary Examiner—Reinhard J. Eisenzopf
Assistant Examiner—Vinh P. Nguyen
Attorney, Agent, or Firm—William L. Fisher

[57] ABSTRACT

A leadless current-sensing device for sensing current flowing in a conductor when the device is positioned in the vicinity of the current-carrying conductor. The device has a probe having a set of two current sensors disposed at a preset radial angle alpha "α" in respect to each other. The probe also has a second set of two current sensors also disposed at the same preset radial angle in respect to each other. The first and second sets of current sensors are disposed at a preset radial angle delta "δ" in respect to each other. The first and second sets of current sensors are also disposed at a preset axial distance "z" in respect to each other. The device includes a voltage processing circuit for processing the four distinct voltage potentials induced in the four current sensors. The processing circuit compares to each other two voltage potentials from either set of current sensors to calculate the orientation angle that each current sensor makes with the conductor. The processing circuit also compares the greater voltage potential from the first set of current sensors to the greater voltage potential from the second set of current sensors to calculate a voltage ratio between them and uses this voltage ratio along with an orientation angle and the preset axial distance "z" to calculate the linear distance of the probe from the conductor. Once the orientation angle and the linear distance of the probe from the conductor are known the device calculates the magnitude of the current flowing in the conductor.

30 Claims, 5 Drawing Sheets

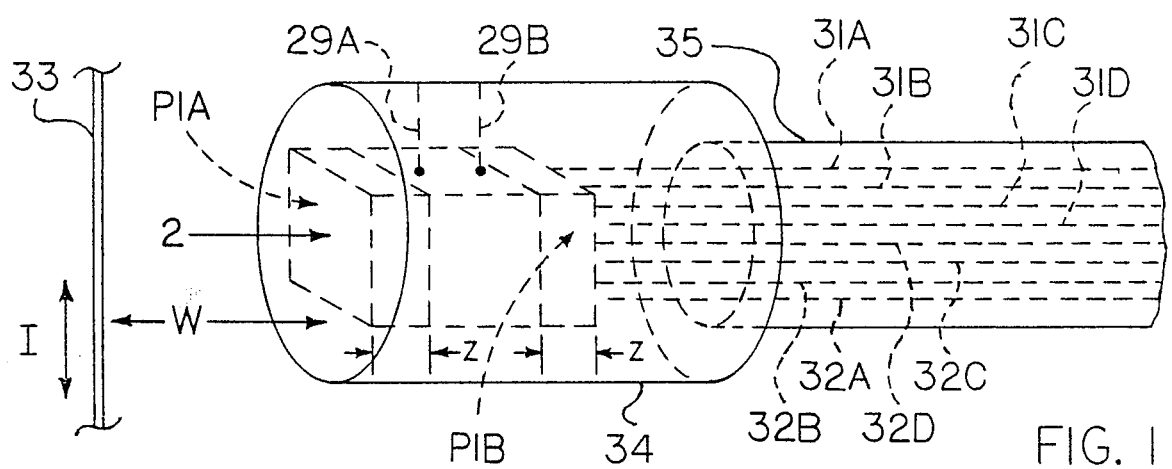
FIG. 1
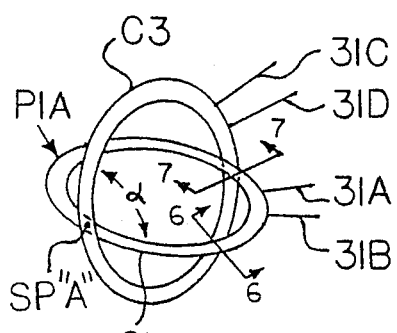
FIG. 3
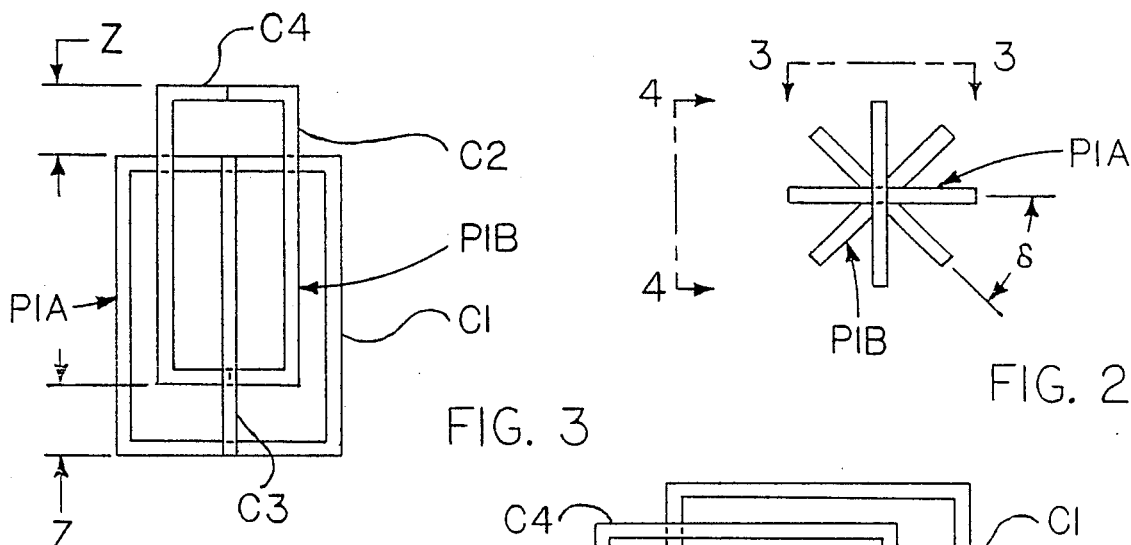
FIG. 2
FIG. 4
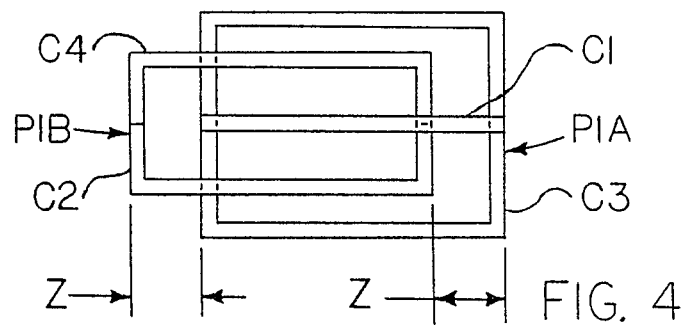
FIG. 5
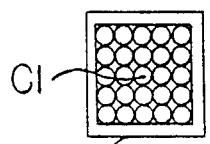
FIG. 6
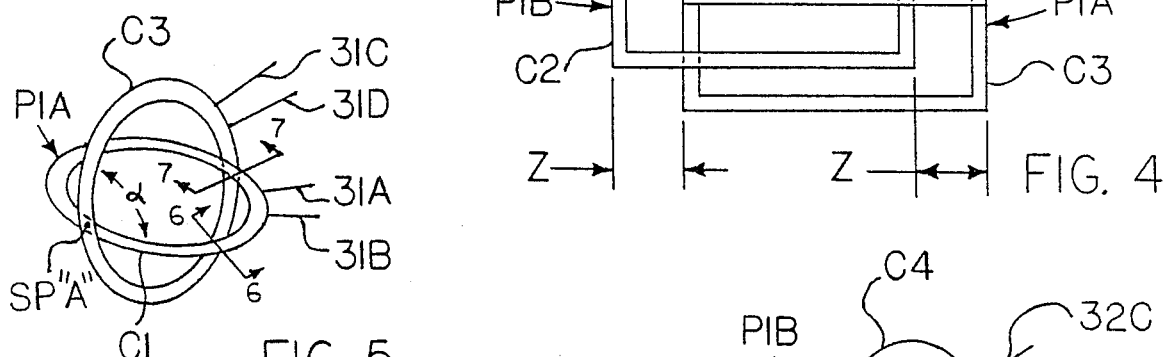
FIG. 7
FIG. 8

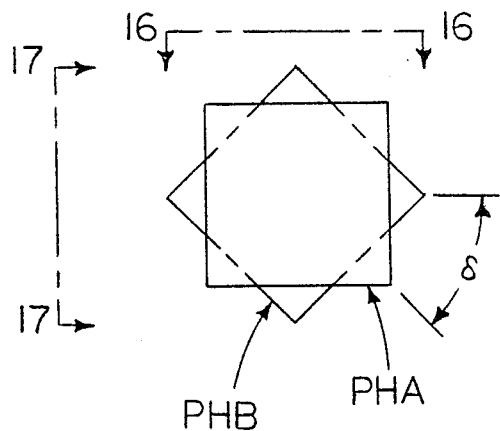
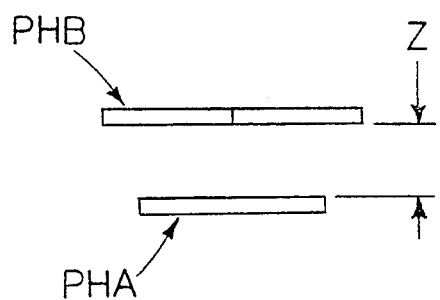
FIG. 15
FIG. 16
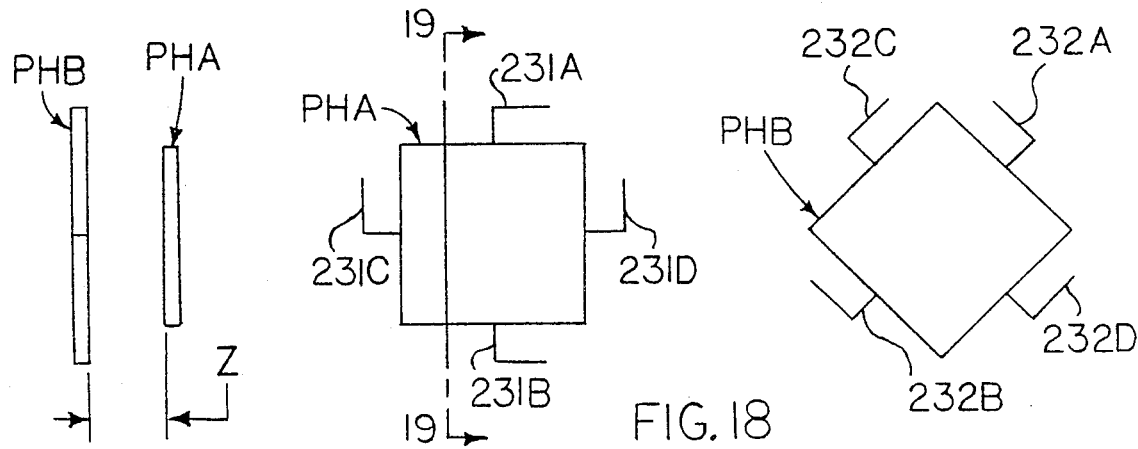
FIG. 17
FIG. 18
FIG. 20
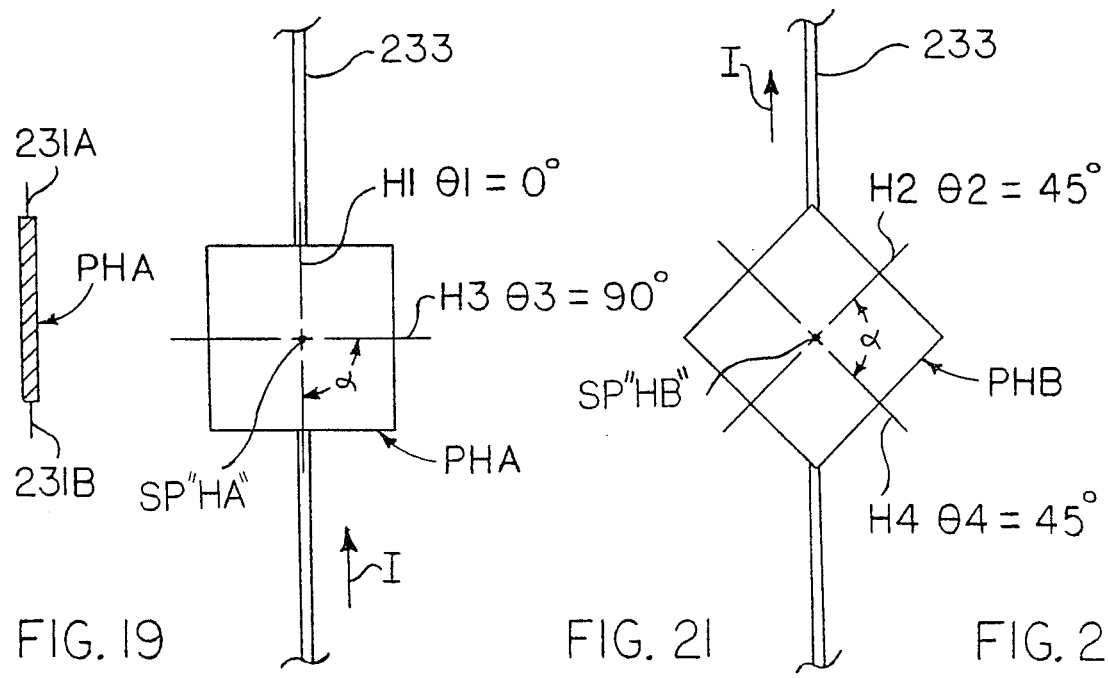
FIG. 19
FIG. 21
FIG. 22

LEADLESS CURRENT-SENSING SYSTEM

My invention relates to current-sensing devices.

BACKGROUND OF THE INVENTION

Present current-measuring devices are clamp-around devices which employ magnetic cores having arms that wrap around or clamp onto a current-carrying wire. The current in the wire or conductor (whose current is to be measured) induces a magnetic flux in the core of the clamp-around device which varies with the magnitude of the current flowing in the conductor. Coils wound upon the core respond to the induced magnetic flux and produce a current that is used to deflect a galvanometer needle which indicates the magnitude of the current flowing in the wire or conductor.

These clamp-around type current-measuring devices have disadvantages, however, which limit their applications. For example, the two arms of the clamp-around core normally must touch each other and therefore can not be used where the current-carrying conductor is disposed in tight locations which prevent the arms of the core from encircling such current-carrying conductor. And, of course, these clamp-around type current-measuring devices cannot be used for printed circuits such as are used on printed circuit boards since, in such case, there are no wires or conductors to encircle. Also, these clamp-around type current-measuring devices are normally capable of determining only one unknown variable which is the magnitude of the current flowing in the current-carrying conductor. These clamp-around type current-measuring devices are not capable of determining their linear distance relative to the current-carrying conductor.

SUMMARY OF THE INVENTION

The principal object of my invention is to provide a current-sensing device or probe and method of current sensing. My current-sensing device, when placed near a current-carrying conductor, can determine the location thereof, i.e. it can determine: (a) the angle orientation between the current-carrying conductor and the device or probe (angle theta "$\theta$" to be later defined); and (b) the linear distance of the current-carrying conductor from the device or probe (linear distance "w" to be later defined). Both of these measurements (linear distance "w" and angle theta "$\theta$") can be made without acertaining the magnitude of the current flowing in the conductor. On the other hand, the magnitude of the current in the current-carrying conductor can also be determined and these measurements (linear distance "w" and angle theta "$\theta$") are used to determine the current magnitude.

My process involves simply moving the probe into the vicinity of a current-carrying conductor, in which case, the angle orientation (angle theta "$\theta$") between the conductor and the probe is an unknown variable, the linear distance of the conductor from the probe (linear distance "w") is an unknown variable, and the magnitude of the current flowing in the conductor is an unknown variable. Once moved into place, the probe will determine the angle orientation (angle theta "$\theta$") firstly, the linear distance from the conductor (linear distance "w") secondly, and the current magnitude flowing in the conductor thirdly. All three of these unknown variables are determined by the probe automatically and without the probe coming into contact with the current-carrying conductor.

BRIEF DESCRIPTION OF THE DRAWINGS

FIG. 1 is a perspective view of an AC probe used with my device disposed adjacent to a current-carrying conductor (carrying alternating current in the instance);

FIG. 2 is a front elevational view, with parts removed, of the AC probe of FIG. 1 looking into the tip thereof in the direction of the arrow "2" shown in FIG. 1;

FIG. 3 is a top plan view of the structure of FIG. 2 taken on line 3—3 thereof; for drawing simplicity, the coils C1 through C4 are shown having a rectangular annulus instead of a circular one (as is their preferred shape);

FIG. 4 is a side elevational view of the structure of FIG. 2 taken on line 4—4 thereof; for drawing simplicity, the coils C1 through C4 are shown having a rectangular annulus instead of a circular one (as is their preferred shape);

FIG. 5 is a perspective view of coils C1 and C3 of the AC probe; for drawing simplicity, the coils C1 and C3 are each shown having a circular annulus; each is also shown as having a circular cross-section;

FIG. 6 is a cross sectional view of the coil C1 of FIG. 5 taken on the line 6—6 thereof except that the cross-section is shown square as is the case in actual construction;

FIG. 7 is a cross sectional view of the intersection of the coils C1 and C3 of FIG. 5 taken on the line 7—7 thereof except that the cross-section of coil C1 is shown square as is the case in actual construction; FIG. 8 is a perspective view of coils C2 and C4 of the AC probe; for drawing simplicity, the coils C2 and C4 are shown having a circular annulus; each is also shown as having a circular cross-section;

FIG. 15 is a front elevational view, with parts removed, of the DC probe of FIG. 14 looking into the tip thereof in the direction of the arrow "15" shown in FIG. 14;

FIG. 16 is a top plan view of the structure of FIG. 15 taken on the line 16—16 thereof;

FIG. 17 is a side elevational view of the structure of FIG. 15 taken on line 17—17 thereof;

FIG. 18 is a front elevational view of only one of the Hall Effect plates of the DC probe;

FIG. 19 is a cross sectional view of the structure of FIG. 18 taken on the line 19—19 thereof;

FIG. 20 is a front elevational view of the other one of the Hall Effect plates of the DC probe;

FIG. 21 is a top plan view of the Hall Effect plate of FIG. 18 shown disposed adjacent to a current-carrying conductor (carrying direct current in the instance);

FIG. 22 is a top plan view of the Hall Effect plate of FIG. 20 shown disposed adjacent to a current-carrying conductor (carrying direct current in the instance);

DESCRIPTION OF MY DEVICE USING THE A.C. PROBE

Referring first to FIGS. 1–13 and to the embodiment of my invention shown therein, a current-sensing device having an AC probe for sensing alternating current is disclosed. The AC probe includes a front set of two coils, C1 and C3, and a rear set of two coils, C2 and C4. The front set of coils, C1 and C3, and the rear sets of coils, C2 and C4, are represented schematically by dash lines in FIG. 1; the front set is designated sensor PIA and the rear set, sensor PIB. While FIG. 2 is a front elevational view of FIG. 1 with casing 34 removed, it does not show the sensors PIA and PIB schematically, as does FIG. 1. Rather, FIG. 2 attempts to depict the actual coils C1 and C3 (of front sensor PIA) and the actual coils C2 and C4 (of rear sensor PIB) as viewed in the direction of the arrow 2 (the probe casing, designated 34, being removed for drawing simplicity). FIGS. 3 and 5 do likewise from a top plan position. FIG. 5 shows the front set of coils, C1 and C3, separate from the rear set of coils, C2 and C4, which are shown by themselves in FIG. 8.

Figure 9:
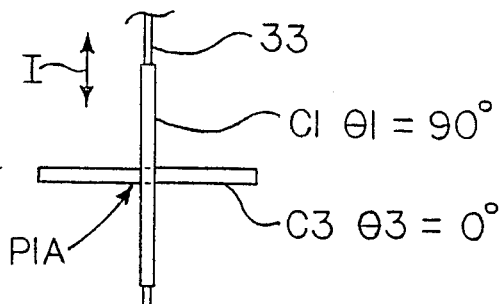
FIG. 9 is a top plan view of a portion only of the coils C1 and C3 of the AC probe shown disposed adjacent to a current-carrying conductor (carrying alternating current in the instance)
Figure 10:
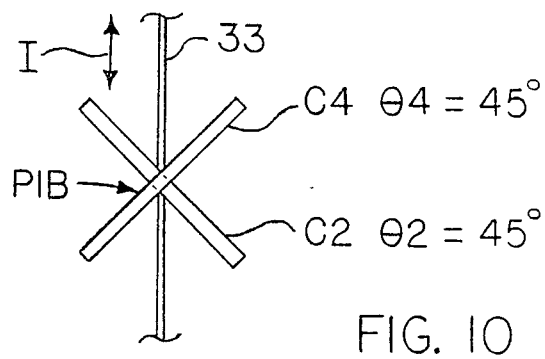
FIG. 10 is a top plan view of a portion only of the coils C2 and C4 of the AC probe shown disposed adjacent to a current-carrying conductor (carrying alternating current in the instance)
Figure 11:
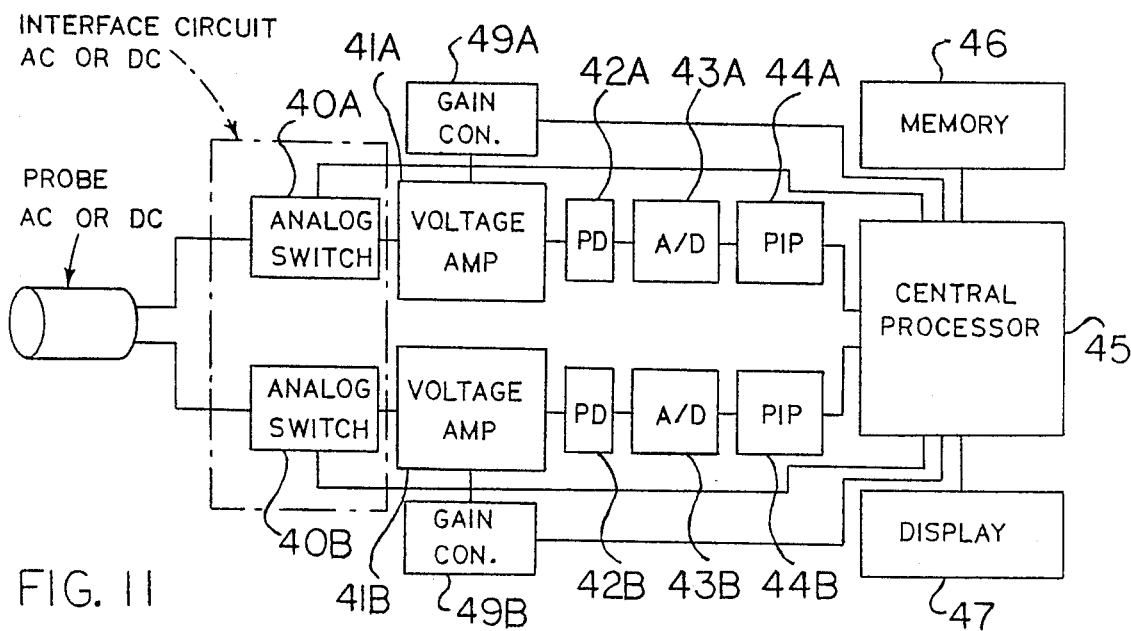
FIG. 11 is a schematic diagram of one embodiment of a processing circuit used with my device.
Figure 12:
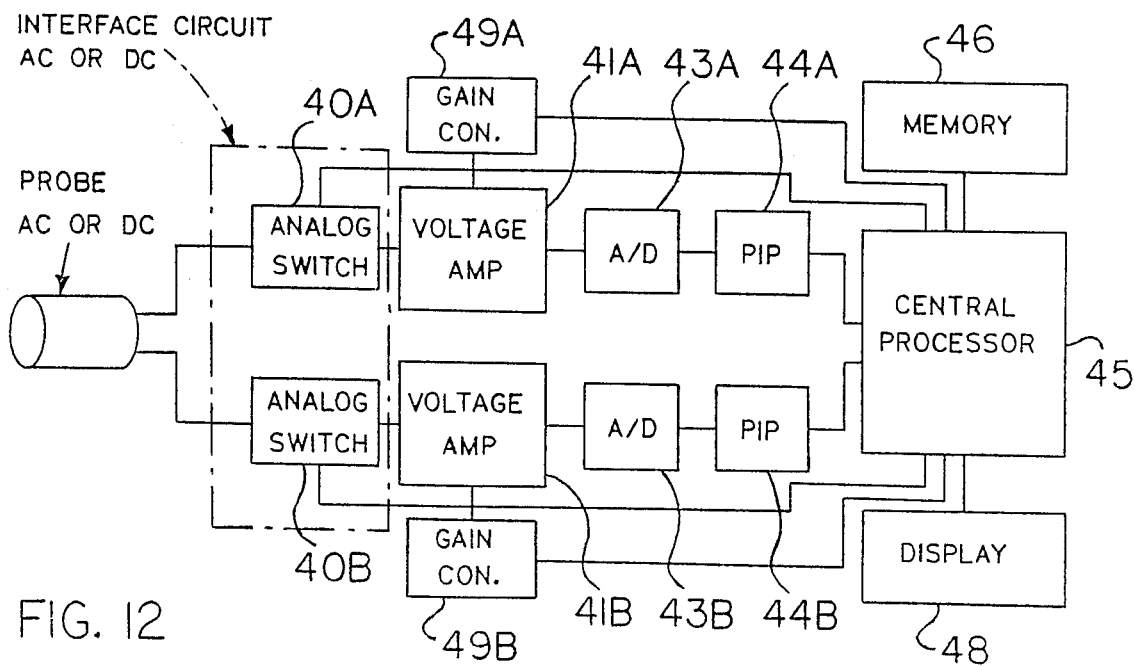
FIG. 12 is a schematic diagram of another embodiment of a processing circuit used with my device.

When the AC probe is brought into the vicinity of a current-carrying conductor, designated 33, (carrying alternating current "I", in the instance) (FIGS. 1, 9 and 10), the magnetic field surrounding the conductor 33 will induce instantaneous voltage potentials into the front and rear sensors PIA and PIB respectively. These voltages, corresponding to those induced in the four coils C1 through C4, respectively, are separately processed (i.e. amplified, and converted from analog to digital signals; FIGS. 11 and 12) and separately fed into a central processor 45 for sampling them and comparing them with each other. The magnitudes of the voltages V1 and V3 in the front sensor PIA (i.e. in the coils C1 and C3) are compared with each other and the ratio of them is calculated by the central processor 45 and used by it to determine angle orientation (theta "$\theta$"; FIG. 9) of the AC probe with respect to the current-carrying conductor 33. The magnitudes of the voltages V2 and V4 in the rear sensor PIB (i.e. in the coils C2 and C4) are also compared with each other and the ratio of them is calculated by the central processor 45 and used by it to determine the same angle orientation (theta "$\theta$"; FIG. 10) of the AC probe with respect to the current-carrying conductor 33. Two angle orientation readings may be obtained in order to check one against the other or only a single angle orientation may be determined depending upon how the central processor 45 is programmed. The ratio of the higher voltage in the front sensor PIA (i.e. V1 and V3) to that in the rear sensor PIB (i.e. V2 or V4) is determined by the central processor 45 and used by it to determine the distance "w" (FIG. 1) between the tip of the AC probe and the current-carrying conductor 33. Current magnitude in the current-carrying conductor 33 is determined by the central processor 45 by calculation from the values both of the angle theta "$\theta$" and of the distance "w".

The two coils of each set, either those (C1 and C3) for front sensor PIA or (C2 and C4) for rear sensor PIB, are so oriented with respect to each other that they form a radial angle alpha "$\alpha$" (FIGS. 6 and 8) between them. In the instance shown in the drawings, the angle alpha "$\alpha$" for front sensor PIA is 90 degrees (FIG. 5) and likewise for the rear sensor PIB (FIG. 8). Each of the four coils, C1 through C4, is constructed identically as the other, i.e. circular in length as shown in FIGS. 5 and 8. Each lies in a single flat plane, herein referred to as the plane of the coil. Each is formed with a square cross-section, as shown in FIG. 6, due to compaction or layering during the wire-winding process. Each is covered with a outer insulation covering, designated 36, which can be formed of potting compound. The two coils of each set (C1, C3 and C2, C4) are made free of each other over their lengths except at the front and back thereof as shown in FIGS. 5 and 8 where they are physically united to each other as shown in FIG. 7 by being held in close proximity during the potting process. For drawing simplicity, the coils in FIGS. 5 and 8 are shown with circular cross-sections.

The front sensor PIA is held axially separated with respect to the rear sensor PIB at a predetermined axial distance "z" (FIGS. 1, 3 and 4). The front and rear sensors PIA and PIB are also held radially separated with respect to each other at a radial angle delta "$\delta$" (45 degrees in the instance as shown in FIG. 2).

The casing or shell 34 of the AC probe is preferably made of plastic or synthetic resin, as is well known in the art; as such it is magnetically permeable. The shell 34 has a hollow cylindrical body and flat rear and front faces, as shown. A suitable non-metallic anchor 29A (FIG. 1) made of plastic or synthetic resin attaches at its ends to the top of the cylindrical portion of the casing 34 for holding the set of coils C1 and C3 for the front sensor PIA properly positioned both axially and radially within the front casing 34. The front tip of the front sensor PIA is held slightly rearwardly of the plane of the front edge of the shell 34 (for physical protection) but as close thereto as possible in order to better pick up weak currents in the current-carrying conductor 33. Another non-metallic anchor 29B (FIG. 1) of similar construction attaches to the cylindrical portion of the casing 34 for holding the set of coils C2 and C4 for the rear sensor PIB properly positioned both axially and radially.

When the current-sensing device having the AC probe is constructed as described, same can sample the magnetic field in the current-carrying conductor 33 at two points: one sampling point, designated SP "A" (FIG. 5) corresponds to the tip of the front sensor PIA and the other sampling point, designated SP "B" (FIG. 8) corresponds to the tip of the rear sensor PIB. When the tip of the AC probe is brought near the current-carrying conductor 33, the front sensor PIA will receive two distinct voltages, V1 and V3, and the rear sensor PIB will also receive two distinct voltages, V2 and V4, since the two sensors are spaced from each other axially by the distance "z". The four voltages V1 through V4 are processed by the central processor 45 (FIGS. 11 and 12) to determine the ratio of two voltages on one of the sensors PIA or PIB and used by it to determine angle orientation (theta "$\theta$"). In most instances it will be the ratio (V1/V3 or V3/V1) of the two voltages V1 and V3 from the front sensor PIA that will be used to determine orientation angle theta "$\theta$"; in some cases, it can be the ratio (V2/V4 or V4/V2) of the two voltages V2 and V4 on the rear sensor PIB that is so used.

The orientation angle theta "$\theta$" is the angle (between zero and 90 degrees) made by the plane of any one of the coils C1 through C4 and the current-carrying conductor 33. FIGS. 9 and 10 (to which more detailed reference will be made later) illustrates this orientation angle theta "$\theta$". FIG. 9 shows the orientation angle theta "$\theta$" for coil C1 (in respect to the current-carrying conductor 33) to be 90 degrees, while that for coil C3 to be zero degrees. FIG. 10 shows the orientation angle theta "$\theta$" for coil C2 (in respect to the current-carrying conductor 33) to be 45 degrees, while that for coil C4 to be 45 degrees also. The angle orientation (theta "$\theta$") of the front set of coils C1 and C3 affects the magnitude of the voltages V1 and V3; as the orientation angle theta "$\theta$" decreases, the magnitude of one of these voltages will increase, while that of the other will decrease. The angle orientation (theta "$\theta$") of the rear set of coils C2 and C4 likewise affects the magnitude of the voltage V2 and V4. As will appear, there is a relationship between the arctangent of the orientation angle (theta "$\theta$") and the ratio of the particular pair of voltages (V1/V3, V3/V1, V2/V4 or V4/V2).

The pair of voltages V1 and V3 received by the front sensor PIA are compared with each other in the central processor 45 to determine which is higher; likewise for the voltages V2 and V4 received by the rear sensor PIB. The higher voltage from the front sensor PIA is compared to the higher voltage from the rear sensor PIB to obtain a further or new ratio (the higher voltage of the voltages V1 and V3 as the numerator and the higher voltage of the voltages V2 and V4 as the denominator of a fraction) which, along with the predetermined distance "z", is used by the central processor 45 to determine the distance "w" (FIG. 1) between the current-carrying conductor 33 and the front tip of the front sensor PIA. Once both the distance "w" and the angle orientation theta "$\theta$" of the AC probe (with respect to the current-carrying conductor 33) are known, two other things or data become determined. One is the exact location of the current-carrying conductor 33 in relation to the AC probe and the other is the magnitude of the alternating current ("I" in FIGS. 1, 9 and 10) in the current-carrying conductor 33. The exact location of the current-carrying conductor 33 in relation to the AC probe will always be given in terms of coordinates, i.e. distance "w" plus angle orientation (theta "$\theta$"). The current magnitude is determined by calculation by the central processor 45.

To assure accuracy, the AC probe should be placed near the current-carrying conductor 33 so that the axis of the AC probe is substantially perpendicular to the axis of the current-carrying conductor 33 as shown in FIG. 1. However, the AC probe is useful even for positions that are off the perpendicular; i.e. at significant angles to the the perpendicular (i.e. 25 degrees). Disposing the AC probe off the perpendicular by as much as 20 degrees therefrom will result in little or no change in the determination of the angle theta "$\theta$" and only a small error (about 5%) in the determination of the distance "w" and the same error (about 5%) in the calculation of the current magnitude in the current-carrying conductor 33.

The AC probe, as shown in FIG. 1, includes, in addition to the shell 34, a metallic wire-holding casing or shell 35 (made of magnetically shielded coaxial cable). The rear end of the probe casing 34 and the front end of the wire-holding casing 35 are made fast to each other by well known means (not shown). Between the rear end of the wire-holding casing 35 and the front end of the processing circuit of FIG. 13, a quick-disconnect coupling is provided as shown and indicated at 60. The quick-disconnet coupling 60 enables the AC probe to be quickly and easily disconnected from the interface circuit of FIG. 13.

Figure 13:
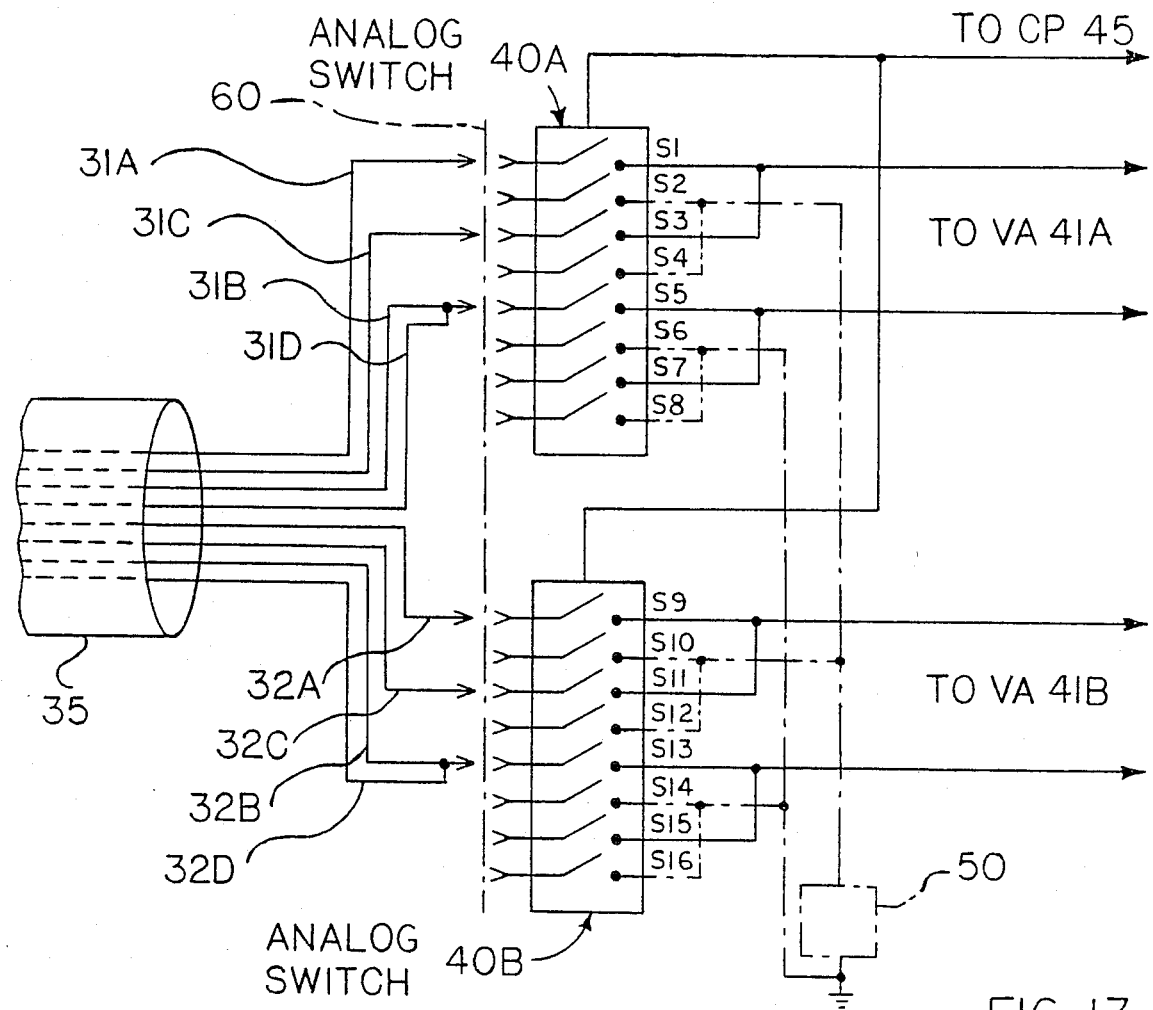
FIG. 13 is a schematic diagram of an interface circuit which interfaces the AC probe with the processing circuit of either FIG. 11 or FIG. 12.

The AC probe is electrically connected to the interface circuit of FIG. 13 by eight lead-out wires frabricated within the wire-holding casing 35 (wires 31A through 31D and 32A through 32D, see FIGS. 1, 5, 8 and 13). With the AC probe in place, four of the lead-out wires (31A through 31D) connect to the front sensor PIA (two for each of the coils C1 and C3) and four of the lead-out wires (32A through 32D) connect to the rear sensor PIB (two for each of the coils C2 and C4). The lead-out wires 31A and 31B connect to the coil C1 and the lead-out wires 31C and 31D connect to the coil C3. The lead-out wires 32A and 32B connect to the coil C2 and the lead-out wires 32C and 32D connect to the coil C4.

The eight lead-out wires (31A through 31D and 32A through 32D) also connect to the two analog switches 40A and 40B of the AC interface circuit of FIG. 13. These analog switches 40A and 40B are controlled by feedback, as shown, from the central processor (CP) 45 and are the same two analog switches used for the DC probe in the interface circuit of FIG. 23. The analog switches 40A and 40B are preferably wired to receive either the AC probe or the DC probe interchangeably via the quick-disconnect coupling 60. The latter is constructed to make part of the hardware of the analog switches 40A and 40B unused when the AC probe is needed. This is shown in FIG. 13 where only three wires 31A, 31C and (31B, 31D) connect to analog switch 40A and only three wires 32A, 32C and (32B, 32D) connect to analog switch 40B and the constant current source 50 is shown in dash-dot lines because, though physically present, it is electrically out of circuit. The analog switches 40A and 40B of the interface circuit (FIG. 13), are each designed to apply a distinct voltage signal at the same time to two separate voltage amplifiers (VA) 41A (FIG. 11 or FIG. 12) and 41B (FIG. 11 or FIG. 12), respectively, of a processing circuit (either that of FIG. 11 or that of FIG. 12). Each of the voltage amplifiers 41A and 41B has at least two input elements, one of which serves as the principal input while the other serves as ground (or as a reference voltage above ground as desired).

The analog switch 40A (FIGS. 11 or 12) applies the voltages V1 or V3 from the front sensor PIA and the analog switch 40B (FIGS. 11 or 12) applies the voltages V2 or V4 from the rear sensor PIB. In other words, when voltage V1 or coil C1 is switched on by analog switch 40A, voltage V3 of coil C3 is switched off (by the same analog switch 40A) or vice versa. Likewise, when voltage V2 of coil C2 is switched on by analog switch 40B, voltage V4 of coil of C4 is switched off (by the same analog switch 40B) or vice versa. Each analog switch, 40A and 40B, contains eight internal switches (FIG. 13). When closed, each internal switch is a single conducting path. For the analog switch 40A, the internal switches are S1, S2, S3, S4, S5, S6, S7 and S8 and, of these, only switches S1, S3, and S5 are used for the AC probe. The switch S5 is used to establish a common connection for a portion of the output from the front sensor PIA. For the analog switch 40B, the internal switches are S9, S10, S11, S12, S13, S14, S15 and S16 and, of these, only switches S9, S11 and S13 are used for the AC probe. The switch S13 is used to establish a common connection for a portion of the output from the front sensor PIB.

For sensor PIA the lead-out wires 31A and 31B of coil C1 are connected to internal switches S1 and S5, respectively, of analog switch 40A, while the lead-out wires 31C and 31D of coil C3 are connected to internal switches S3 and S5, respectively, of analog switch 40A (FIG. 13). During operation, the switches S1 and S3 will apply either of the voltages V1 or V3 of the two coils C1 or C3 (from the front sensor PIA) to one element (via lines 31A or 31C; FIG. 13) of the voltage amplifier 41A (FIG. 11 or 12). All during the time of operation of the central processor 45, switch S5 is maintained closed by said central processor 45 in order to connect lead-out wires 31B and 31D (connected in common with each other as shown in FIG. 13) to another element (via lines 31B or 31D; FIG. 13) of the voltage amplifier 41A; said other element being the ground input thereof. For voltage V1, it is the voltage potential between lead-out wires 31A and 31B which is applied to said two elements of the voltage amplifier 41A, while for voltage V3, it is the voltage potential between lead-out wires 31C and 31D that is so applied.

For sensor PIB the lead-out wires 32A and 32B of coil C2 are connected to internal switches S9 and S13 of analog switch 40B, while the lead-out wires 32C and 32D of coil C4 are connected to internal switches S11 and S13, respectively, of analog switch 40B (FIG. 13). During operation, the switches S9 and S11 will apply either of the voltages V2 or V4 of the two coils C2 or C4 (from the rear sensor PIB) to one element (via lines 32A or 32C; FIG. 13) of the voltage amplifier 41B (FIG. 11 or FIG. 12). All during the time of operation of the central processor 45, switch S13 is maintained closed by said central processor 45 in order to connect lead-out wires 32B and 32D (connected in common with each other as shown in FIG. 13) to another element (via lines 32B or 32D; FIG. 13) of the voltage amplifier 41B; said other element being the ground input thereof. For voltage V2, it is the voltage potential between lead-out wires 32A and 32B which is applied to said two elements of the voltage amplifier 41B, while for voltage V4, it is the voltage potential between lead-out wires 32C and 32D that is so applied.

For determining angle orientation (theta "$\theta$"), the central processor 45 uses but one of the analog switches 40A (FIGS. 11, 12 and 13) or 40B (FIGS. 11, 12 and 13) at any one time. Analog switch 40A, when used, separately applies voltages V1 and V3 to the voltage amplifier 41A successively, while analog switch 40B, when used, separately applies voltages V2 and V4 to the voltage amplifier 41B successively. As previously explained, the ratio V1/V3 or V3/V1 or V2/V4 or V4/V2 is used to determine angle orientation theta "$\theta$".

For determining distance "w", the central processor 45 uses both analog switches 40A (FIGS. 11 or 12 and 13) and 40B (FIGS. 11 or 12 and 13) simultaneously. Together, these two switches 40A and 40B apply two voltages (the higher of V1 or V3 from the front sensor PIA and the higher of V2 or V4 from the rear sensor PIB) at the same time to the two voltage amplifiers 41A and 41B, resectively. As previously explained, the ratio of (V1 or V3)/(V2 or V4) or (V2 or V4/(V1 or V3), together with the distance "z", is used by the central processor 45 to determine distance "w".

For calculating the magnitude of the current "I" in the current-carrying conductor 33, the central processor 45 does not use either of the analog switches 40A or 40B, but rather calculates the value "I" from the higher of the voltages V1 or V3, the higher of the voltages V2 or V4, the already determined angle orientation (theta "$\theta$") and the already determined distance "w".

DESCRIPTION OF THE THEORY OF OPERATION OF THE AC PROBE

The radial angle alpha "$\alpha$" for the coils C1 and C3 and for the coils C2 and C4 is assumed to be 90 degrees as shown in FIGS. 5 and 8 for the AC probe. When the AC probe is placed near a current-carrying conductor 33, the front set of coils, C1 and C3, are disposed at two orientation angles (theta "$\theta 1$" and theta "$\theta 3$") as shown in FIG. 9 which shows the spacial relationship of the current-carrying conductor 33 and the front set of coils C1 and C3 (the rear set of coils C2 and C4 are omitted for the purpose of clarity). Angles $\theta 1$ and $\theta 3$ in FIG. 9 are assumed as shown in Table A below:

TABLE A

| ANGLE | (FIG. 9) COIL | |
|---|---|---|
| $\theta 1$ | C1 | (90 degrees) |
| $\theta 3$ | C3 | (0 degrees) |

The rear set of coils will be disposed at two other orientation angles (theta "$\theta 2$" and theta "$\theta 4$") as shown in FIG. 10 which shows the spacial relationship of the current-carrying conductor 33 and the rear set of coils C2 and C4 (the front set of coils C1 and C3 being omitted for the purpose of clarity). Angles $\theta 2$ and $\theta 4$ in FIG. 10 are assumed as shown in Table B below:

TABLE B

| ANGLE | (FIG. 10) COIL | |
|---|---|---|
| $\theta 2$ | C2 | (45 degrees) |
| $\theta 4$ | C4 | (45 degrees) |

The magnetic field generated by the current-carrying conductor 33 will induce four different alternating voltages in the coils C1 through C4 which are designated V1 through V4, respectively. For each coil the respective induced alternating voltage is determined by the following general equations:

$$V = \frac{-d}{dt} \int_s B \cdot ds \quad (1)$$

or $$V = \frac{-d}{dt} \int_s B(\text{dot product}) ds \quad (1A)$$

where;

"V" is the alternating voltage potential induced in any one of the coils C1 through C4.

"$-d/dt$" is the conventional mathematical concept of the derivative of the change of the current "I" with time "t" (in seconds or fractions thereof) in the current-carrying conductor 33 and hence of the change of the magnetic field "B" surrounding said current-carrying conductor 33. The factor of negative one (−1) represents the opposite rise or opposite fall of the alternating voltage "V" induced in the coils C1 through C4 as the alternating current "I" in the current-carrying conductor 33 rises and falls with time "t" (in seconds or fractions thereof).

"B" is a vector quantity representing all those instantaneous values of the magnetic flux cutting the AC probe during the time same is sensing the current "I" in the current-carrying conductor 33. The direction of "B" is the same as that of the magnetic field produced by the current "I" in the current-carrying conductor 33.

"s" is the area in the plane of any of the coils (C1 through C4) and depends upon the size and shape thereof. In the instance shown for coil C2, "s" is equal to "$\pi R^2$" where "R" is the radius of coil C2 (FIG. 8).

"ds" is a vector quantity representing an infinitesimal "slice" of the area "s" for the respective coil as it is being cut by the magnetic field during the time the AC probe is sensing the current "I" in the current-carrying conductor 33. The direction of "ds" is perpendicular to the plane in which the area "s" is disposed. Taking the coil C2 as an example, "s" is the area encompassed by the circumference of the coil C2 (equal to "$\pi R^2$" in the instance).

"." represents the conventional mathematical dot product symbol and constitutes the product of: (i) the vector quantity "B", (ii) the vector quantity "ds", and (iii) the cosine of the angle theta "$\theta$" between their respective directions.

"$\int_s$" is the conventional mathematical concept of the integration, over the area "s", as indicated, of the dot product of the instantaneous values of "ds" and "B".

The magnetic field "B" generated by the current-carrying conductor 33 is also related to the current "I" in the current-carrying conductor 33 by the following equation:

$$B = \frac{uI(t)}{2\pi w} \quad (2)$$

where:
"B" is as just defined.
"I(t)" is the magnitude of the current in the current-carrying conductor 33 as it changes with time "t" (in seconds or fractions thereof).
"w" is as previously defined (i.e.; the distance of the AC probe from the current-carrying conductor 33).
"$2\pi$" takes into consideration the radial effect of the magnetic field strength.
"u" is the permeability of the material inside of the front casing 34. When the front casing 34 is air-filled, "u" is assumed to be equal to that for air (u·) at room temperature, as shown in equation (2) above.

Since the voltages of sensor PIA are V1 and V3, and the voltages of sensor PIB are V2 and V4, then the ratio of V1/V3 or V3/V1, on the one hand, or V2/V4 or V4/V2, on the other, will result in relationships of voltage and orientation angle as shown below. These voltage ratios enable me to obtain the values of the angle orientation (theta "$\theta$"). Having in mind the general equations (1) and (2), and the values of "B", and "ds" therein, for the ratio, for example of V3/V1, the instantaneous values cancel each other with the result of ending up with the ratio of the $\sin\theta/\cos\theta$ or $\tan\theta$ as shown below in equations (6) and (7), respectively:

$$\frac{V3}{V1} = \frac{\frac{-d}{dt} \int_s B3\cos\theta 3\, ds}{\frac{-d}{dt} \int_s B1\cos\theta 1\, ds} \quad (3)$$

$$\frac{V3}{V1} = \frac{\frac{-d}{dt} \int_s \left(\frac{uI(t)}{2\pi w}\right)\cos\theta 3\, ds}{\frac{-d}{dt} \int_s \left(\frac{uI(t)}{2\pi w}\right)\cos\theta 1\, ds} \quad (4)$$

Equation (4) can be reduced to a relationship of voltage and orientation angle as follows:

$$\frac{V3}{V1} = \frac{\cos\theta 3}{\cos\theta 1} \quad (5)$$

$$\frac{V3}{V1} = \frac{\sin\theta 1}{\cos\theta 1} \quad (6)$$

$$\frac{V3}{V1} = \tan\theta 1 \quad (7)$$

where; $\theta 1$ is the angle which the coil C1 makes with the current-carrying conductor 33 (See FIG. 9).

Similarly, the other voltage ratios produce the same ratio of $\sin\theta/\cos\theta$ or $\tan\theta$ as shown in the following equations for voltage ratios V1/V3, V4/V2, and V2/V4:

$$V1/V3 = \tan\theta 3 \quad (8)$$

where; $\theta 3$ is the angle which the coil C3 makes with the current-carrying conductor 33 (See FIG. 9); and $$V4/V2 = \tan\theta 2 \quad (9)$$

where; $\theta 2$ is the angle which the coil C2 makes with the current-carrying conductor 33 (See FIG. 10); and $$V2/V4 = \tan\theta 4 \quad (10)$$

where; $\theta 4$ is the angle which the coil C4 makes with the current-carrying conductor 33 (See FIG. 10).

Thus, any one of the angles $\theta 1$, $\theta 3$, $\theta 2$, or $\theta 4$ (of the coils C1 through C4) is determined from any one of the four voltage ratios as shown above and is the first unknown quantity to be revealed by my invention.

The other three orientation angles are immediately computed from the values of the one first determined since the radial angle delta "$\delta$" (FIG. 2) and the radial angle alpha "$\alpha$" (FIGS. 5 and 8) are fixed parameters determined by the particular hardware for that specific AC probe.

From the orientation angle of a coil from the sensor PIA and the orientation angle of a coil from the sensor PIB, the distance "w" is determined as follows.

One of the voltages V1 or V3 with its respective angle $\theta 1$ or $\theta 3$ and one of the voltages V2 or V4 with its respective angle $\theta 2$ or $\theta 4$ and the known distance "z" are used to calculate the unknown distance "w" (between the front tip of the front sensor PIA and the conductor 33). In order to assure accuracy, the switching accomplished by the AC interface circuit of FIG. 13 is controlled by the central processor 45 to automatically utilize the higher of the two voltages from each of the sensors PIA and PIB. The central processor 45 is programmed to utilize the geometry of the coils C1 through C4, the distance "z" (which is a fixed parameter determined by the particular hardware for the specific AC probe), the angles $\theta 1$, $\theta 3$, $\theta 2$, or $\theta 4$, and a ratio of the higher voltage from the front sensor PIA in respect to the higher voltage from the rear sensor PIB, (or vice versa) to calculate the value of the distance "w". Again, these voltage ratios enable me to obtain the value of the distance "w" using the following relationship:

$$w = f\left( \frac{V1 \text{ or } V3}{V2 \text{ or } V4}, \text{ and } z, \text{ and } \theta 1 \text{ or } \theta 3, \text{ and } \theta 2 \text{ or } \theta 4 \right) \quad (11)$$

This distance "w" is the second and final unknown quantity to be revealed by my invention before the current "I" in the current-carrying conductor 33 is calculated.

Having in mind the general equations (1) and (2), and the values of "B" and "ds" therein, for the ratio, for example of (V1 or V3)/(V2 or V4), the instantaneous values cancel each other with the result of ending up with a relationship between "w" and "z" as shown below:

$$\frac{V1 \text{ or } V3}{V2 \text{ or } V4} = \frac{\frac{-d}{dt} \int_s (B1 \text{ or } B3)\cos(\theta 1 \text{ or } \theta 3)ds}{\frac{-d}{dt} \int_s (B2 \text{ or } B4)\cos(\theta 2 \text{ or } \theta 4)ds} \quad (12)$$

$$\frac{V1 \text{ or } V3}{V2 \text{ or } V4} = \frac{\frac{-d}{dt} \int_s \left( \frac{uI(t)}{2\pi w} \right)\cos(\theta 1 \text{ or } \theta 3)ds}{\frac{-d}{dt} \int_s \left( \frac{uI(t)}{2\pi (w+z)} \right)\cos(\theta 2 \text{ or } \theta 4)ds} \quad (13)$$

Equation (13) can be reduced to a simple function with just one unknown "w":

$$w = f\left( \frac{w}{w+z} \right) \quad (14)$$

Once the distance "w" is determined, it can be used to determine the magnetic flux "B" since "s" and the instantaneous induced voltage "V" (i.e. V1, V3, V2, or V4) are known using the relationship derived from the general formula (1) and the following equations (15) and (15A):

$$\frac{-d}{dt} \int_s B \cdot ds = V \quad (15)$$

or $$\frac{-d}{dt} \int_s B(\text{dot product})ds = V \quad (15A)$$

The orientation angle theta "$\theta$" is taken into consideration in equations (15) and (15A) from the use of the dot product "·" therein. The magnitude of the current "I" in the current carrying conductor 33, as it changes with time "t", can then be calculated from the magnetic flux "B" using the following formula derived from equation (2):

$$I(t) = \frac{B 2\pi w}{u} \quad (16)$$

DESCRIPTION OF MY DEVICE USING THE D.C. PROBE

Referring now to FIGS. 14–23 and to the embodiment of my invention shown therein, a current-sensing device having a DC probe for sensing direct current is disclosed. The DC probe includes two Hall Effect plates, one forward, designated PHA, and one rearward, designated PHB. The front and rear Hall Effect plates PHA and PHB, respectively, are represented schematically by dash lines in FIG. 14. While FIG. 15 is a front elevational view of FIG. 14, it shows the sensors PHA and PHB actually as viewed in the direction of the arrow 15 (the probe casing, designated 234, being removed for drawing simplicity), rather than schematically as in the case of FIG. 14. FIGS. 16 and 17 do likewise from a top plan position. FIG. 18 shows the front Hall Effect plate PHA by itself; FIG. 20 does likewise for the rear Hall Effect plate PHB.

Figure 14:
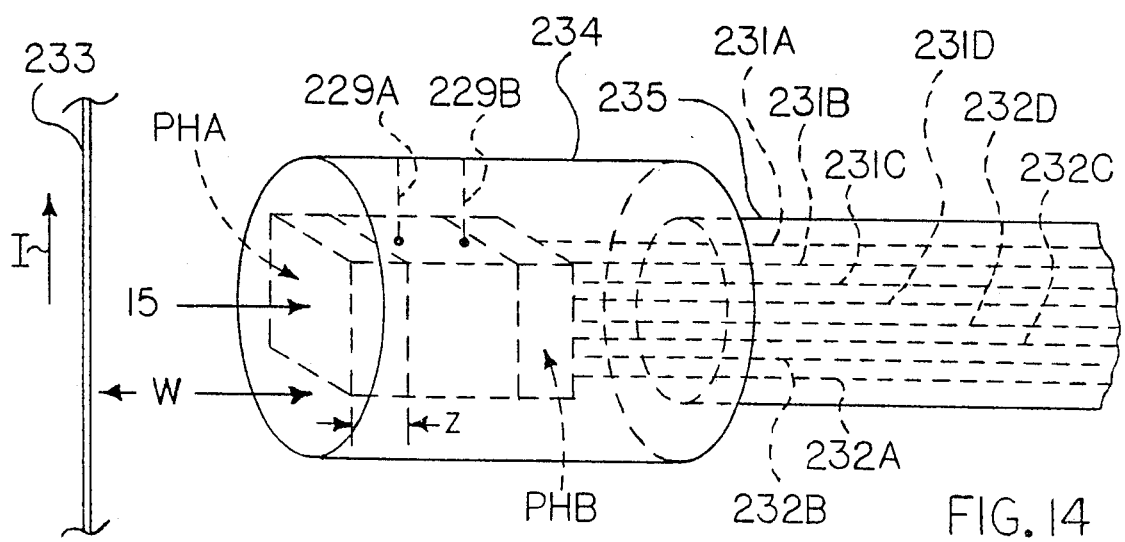
FIG. 14 is a perspective view of a DC probe used with my device disposed adjacent to a current-carrying conductor (carrying direct current in the instance)
Figure 23:
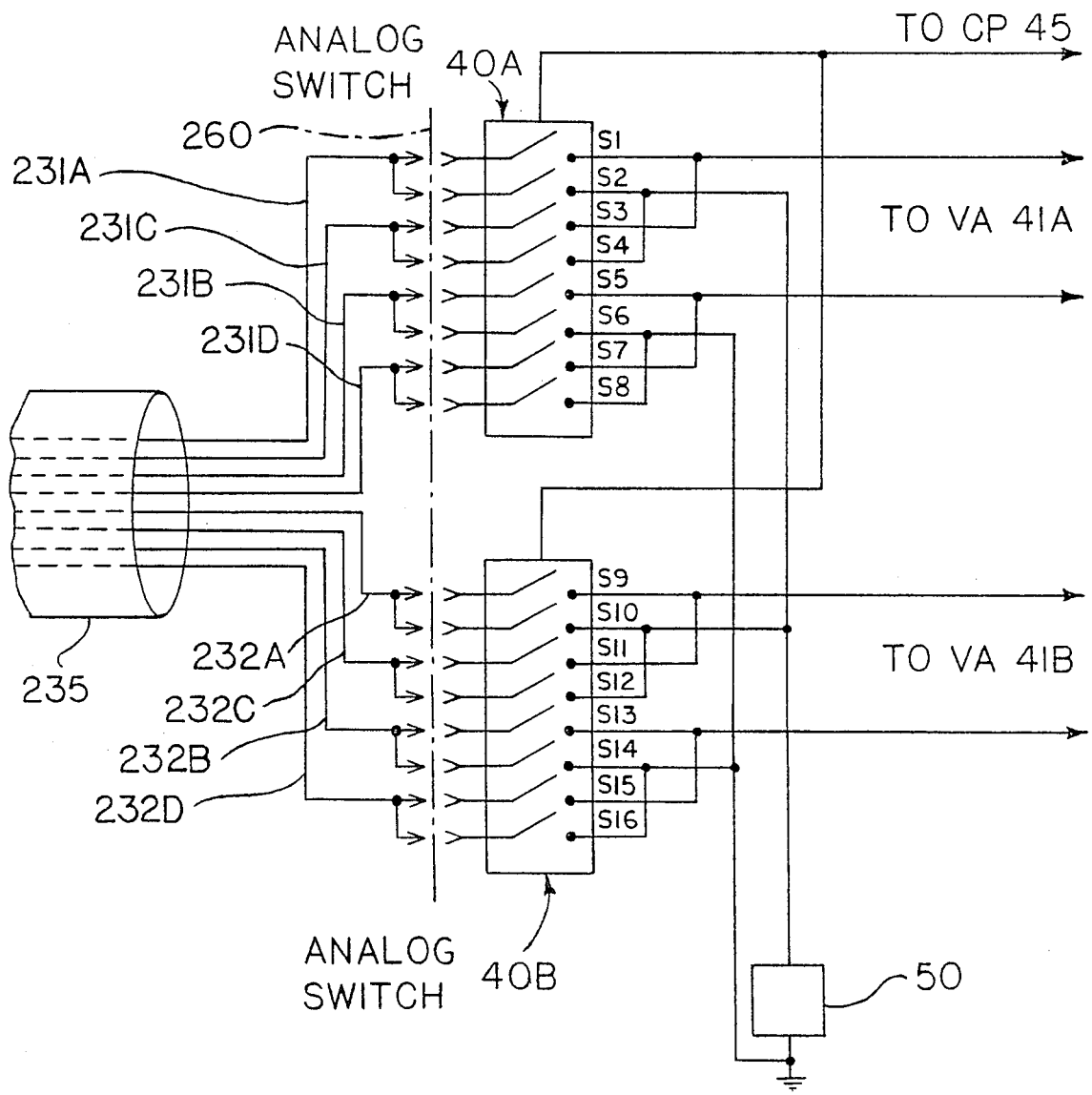
FIG. 23 is a schematic diagram of an interface circuit which interfaces the DC probe with the processing circuit of either FIG. 11 or FIG. 12.

Each of the plates PHA and PHB is made of any solid conducting material as shown in FIG. 19 which is a cross section of the Hall Effect plate PHA. Each of the plates PHA and PHB is connected to a conventional constant current source as shown and indicated schematically at 50 in FIG. 23. The constant current source 50 is a well known device having its own external power supply (not shown). The plate PHA has two current-conducting paths, H1 and H3, which are individually connected, respectively, to the same constant current source 50 via wires 231A, 231B, and 231C, 231D (FIG. 18) and switches S1 through S8 (FIG. 23). The plate PHB has two current-conducting paths H2 and H4 which are likewise individually connected, respectively, to the constant current source 50 via wires 232A, 232B, and 232C, 232D (FIG. 20) and switches S9 through S16 (FIG. 23). The two plates are held axially separated from each other at a predetermined axial distance "z" (FIGS. 14, 16 and 17). The front and rear sensors PHA and PHB are also held radially separated with respect to each other at a radial angle delta "$\delta$" (45 degrees in the instance as shown in FIG. 15).

The casing or shell 234 of the DC probe also is preferably made of plastic or synthetic resin, as is well known in the art; as such it is magnetically permeable. The shell 234 has a hollow cylindrical body and flat front and rear faces, as shown. A suitable non-metallic anchor 229A (FIG. 14) made of plastic or synthetic resin attaches at its ends to the top of the cylindrical portion of the casing 234 for holding the Hall Effect plate for the front sensor PHA properly positioned both axially and radially within the front casing 234. The plane of the front Hall Effect plate of the front sensor PHA is held slightly rearwardly of the plane of the front edge of the front shell 234 (for physical protection) but as close thereto as possible in order to better pick up weak currents in the conductor, designated 233. Another non-metallic anchor 229B (FIG. 14) of similar construction attaches to the cylindrical portion of the casing 234 for holding the Hall Effect plate for the rear sensor PHB properly positioned both axially and radially. Each of the plates PHA and PHB is provided with a sensing path H1 or H2 disposed at right angles with respect to its constant current-carrying path H3 or H4 as shown in FIGS. 21 and 22 by the angle alpha "$\alpha$" (90 degrees in the instance). The two paths, H1 and H3, for the front plate PHA are either current-carrying or current sensing, i.e. if H1 is current-carrying, then H3 is current sensing or vice versa. Likewise, the two paths H2 and H4 for the rear plate PHB are also either current-carrying or current sensing. The two paths are electrically interchangeable by the switches S1 through S16 which are grouped into two analog switch devices 40A and 40B as shown in FIG. 23.

When the DC probe is brought into the vicinity of a current-carrying conductor, designated 233, (carrying direct current "I", in the instance) (FIGS. 14, 21 and 22), the magnetic field surrounding the conductor 233 will induce instantaneous voltage potentials into the front and rear sensors PHA and PHB respectively. These voltages, corresponding to those induced in the four current conducting paths H1 through H4, resepectively, are separately processed (i.e. amplified, and converted from analog signals to digital signals; FIGS. 11 and 12) and separately fed into a central processor 45 for sampling them and comparing them with each other. The magnitudes of the voltages V1 and V3 in the front sensor PHA (i.e. in the current-conducting paths H1 and H3) are compared with each other and the ratio of them is calculated by the central processor 45 and used it by it to determine angle orientation (theta "θ"; FIG. 21) of the DC probe with respect to the current-carrying conductor 233. The magnitudes of the voltages V2 and V4 in the rear sensor PHB (i.e. in the current-conducting paths H2 and H4) are also compared with each other and the ratio of them is calculated by the central processor 45 and used by it to determine the same angle orientation (theta "θ"; FIG. 22) of the DC probe with respect to the current-carrying conductor 233. Two angle orientation readings may be obtained in order to check one against the other or only a single angle orientation may be determined depending upon how the central processor 45 is programmed. The ratio of the higher voltage in the front sensor PHA (i.e. V1 or V3) to that in the rear sensor PHB (i.e. V2 or V4) is determined by the central processor 45 and used by it to determine the distance "w" (FIG. 14) between the plane of the front DC sensor PHA and the current-carrying conductor 233. Current magnitude in the current-carrying conductor 233 is determined by the central processor 45 by calculation from the values both of the angle theta "θ" and of the distance "w".

When the current-sensing device having the DC probe is constructed as described, same can sample the magnetic field in the current-carrying conductor 233 at two points: one sampling point, designated SP "HA" (FIG. 21) corresponds to the plane of the front sensor PHA and the other sampling point, designated SP "HB" (FIG. 22) corresponds to the plane of the rear sensor PHB. When the tip of the DC probe is brought near the current-carrying conductor 233, the front sensor PHA will receive two distinct voltages, V1 and V3, and the rear sensor PHB will also receive two distinct voltages, V2 and V4, since the two sensors are spaced from each other axially by the distance "z". The four voltages V1 through V4 are processed by the central processor 45 (FIGS. 11 and 12) to determine the ratio of two voltages on two of the sensors PHA or PHB and used by it to determine angle orientation (theta "θ"). In most instances it will be the ratio (V1/V3 or V3/V1) of the two voltages V1 and V3 from the front sensor PHA that will be used to determine orientation angle theta "θ"; in some cases, it can be the ratio (V2/V4 or V4/V2) of the two voltages V2 and V4 on the rear sensor PHB that is so used.

The orientation angle theta "θ" (FIGS. 21 and 22) is the angle (between zero and 90 degrees) made by any one of the current conducting paths H1 through H4 and the current-carrying conductor 233. FIGS. 21 and 22 (to which more detailed reference will be made later) illustrates this orientation angle theta "θ". FIG. 21 shows the orientation angle theta "θ" for current-conducting path H1 (in respect to the current-carrying conductor 233) to be 90 degrees, while that for current-conducting path H3 to be zero degrees. FIG. 22 shows the orientation angle theta "θ" for current-conducting path H2 (in respect to the current-carrying conductor 233) to be 45 degrees, while that for current-conducting path H4 to be 45 degrees also. The angle orientation (theta "θ") of the front set of paths H1 and H3 affects the magnitude of the voltages V1 and V3; as the orientation angle theta "θ" decreases, the magnitude of one of these voltages will increase, while that of the other will decrease. The angle orientation (theta "θ") of the rear set of paths H2 and H4 likewise affects the magnitude of the voltage V2 and V4. As will appear, there is a relationship between the arctangent of the orientation angle (theta "θ") and the ratio of the particular pair of voltages (V1/V3, V3/V1, V2/V4 or V4/V2).

The pair of voltages V1 and V3 received by the front sensor PHA are compared with each other in the central processor 45 to determine which is higher; likewise for the voltages V2 and V4 received by the rear sensor PHB. The higher voltage from the front sensor PHA is compared to the higher voltage from the rear sensor PHB to obtain a further or new ratio (the higher voltage of the voltages V1 and V3 as the numerator and the higher voltage of the voltages V2 and V4 as the denominator of a fraction) which, along with the predetermined distance "z", is used by the central processor 45 to determine the distance "w" (FIG. 14) between the current-carrying conductor 233 and the plane of the front sensor PHA. Once both the distance "w" and the angle orientation theta "θ" of the DC probe (with respect to the current-carrying conductor 233) are known, two other things or data become determined. One is the exact location of the current-carrying conductor 233 in relation to the DC probe and the other is the magnitude of the direct current ("I" in FIGS. 14, 21 and 22) in the current-carrying conductor 233. The exact location of the current-carrying conductor 233 in relation to the DC probe will always be given in terms of coordinates, i.e. distance "w" plus angle orientation (theta "θ"). The current magnitude is determined by calculation by the central processor 45.

To assure accuracy, the DC probe should be placed near the current-carrying conductor 233 so that the axis of the DC probe is substantially perpendicular to the axis of the current-carrying conductor 233 as shown in FIG. 14. However, the DC probe is useful even for positions that are off the perpendicular; i.e. at significant angles to the the perpendicular (i.e. 25 degrees). Disposing the DC probe off the perpendicular by as much as 20 degrees therefrom will result in little or no change in the determination of the angle theta "θ" and only a small error (about 5%) in the determination of the distance "w" and the same error (about 5%) in the calculation of the current magnitude in the current-carrying conductor 233.

The DC probe, as shown in FIG. 14, includes, in addition to the shell 234, a metallic wire-holding casing or shell 235 (made of magnetically shielded coaxial cable). The rear end of the probe casing 234 and the front end of the wire-holding casing 235 are made fastened to each other by well known means (not shown). Between the rear end of the wire-holding casing 235 and the front end of the processing circuit of FIG. 23 a quick-disconnect coupling is provided as shown and indicated at 260. The quick-disconnect coupling 260 enables the DC probe to be quickly and easily disconnected from the interface circuit of FIG. 23.

The DC probe is electrically connected to the interface circuit of FIG. 23 by eight lead-out wires frabricated within the wire-holding casing 235 (wires 231A through 231D and 232A through 232D, see FIGS. 14, 18, 20, and 23). With the DC probe in place, four of the lead-out wires (231A through 231D) connect to the front sensor PHA (two for each of the conducting paths H1 and H3) and four of the lead-out wires (232A through 232D) connect to the rear sensor PHB (two for each of the conducting paths H2 and H4). The lead-out wires 231A and 231B connect to the path H1 and the lead-out wires 231C and 231D connect to the path H3. The lead-out wires 232A and 232B connect to the path H2 and the lead-out wires 232C and 232D connect to the path H4.

The eight lead-out wires (231A through 231D and 232A through 232D) also connect to the two analog switches 40A and 40B of the DC interface circuit of FIG. 23. These analog switches 40A and 40B are controlled by feedback, as shown, from the central processor (CP) 45 and are the same two analog switches used for the AC probe in the interface circuit of FIG. 13. The analog switches 40A and 40B are preferably wired to receive either the AC probe or the DC probe interchangeably via the quick-disconnect coupling 260. The latter is constructed to use all of the hardware of the analog switches 40A and 40B when the DC probe is used. This is shown in FIG. 23 where all four wires 231A, 231C, 231B, and 231D connect to analog switch 40A and all four wires 232A, 232C, 232B, and 232D connect to analog switch 40B and the constant current source 50 is shown in dark lines because it is electrically used in the circuit and physically present. The analog switches 40A and 40B of the interface circuit (FIG. 23), are each designed to apply a distinct voltage signal at the same time to two separate voltage amplifiers (VA) 41A (FIG. 11 or FIG. 12) and 41B (FIG. 11 or FIG. 12), respectively, of a processing circuit (either that of FIG. 11 or that of FIG. 12). Each of the voltage amplifiers 41A and 41B has at least two input elements, one of which serves as the principal input while the other serves as ground (or as a suitable reference voltage above ground as desired).

The analog switch 40A (FIGS. 11 or 12) applies the voltages V1 or V3 from the front sensor PHA and the analog switch 40B (FIGS. 11 or 12) applies the voltages V2 or V4 from the rear sensor PHB. In other words, when voltage V1 of path H1 is switched on by analog switch 40A, voltage V3 of path H3 is switched off (by the same analog switch 40A) or vice versa. Likewise, when voltage V2 of path H2 is switched on by analog switch 40B, voltage V4 of path H4 is switched off (by the same analog switch 40B) or vice versa. Each analog switch, 40A and 40B, contains eight internal switches (FIG. 23). When closed each internal switch is a single conducting path. For the analog switch 40A, the internal switches are S1, S2, S3, S4, S5, S6, S7 and S8 and of these, all of them are used for the DC probe. For the analog switch 40B, the internal switches are S9, S10, S11, S12, S13, S14, S15 and S16 and of these, all of them (unlike the case of the AC probe) are used for the DC probe. For sensor PHA to accomplish magnetic field measurement in both paths H1 and H3, a predetermined current from the constant current source 50 must be applied to the two lead-out wires 231A and 231B. If the sensor is brought near the current-carrying conductor 233, the magnetic field will affect this known current and will induce a voltage V3 in sensor PHA path H3 that can be measured off the two lead-out wires 231C and 231D. To measure the magnetic field in the second path H1, the DC probe has to switch the same predetermined current so it flows into the lead-out wires 231C and 231D. The induced voltage V1 is then taken off the lead-out wires 231A and 231B. Likewise, sensor PHB uses the same switching of current and voltage measurement between its lead-out wires 232A, 232B, and 232C, 232D. When a predetermined current is applied to lead-out wires 232A and 232B, the voltage V4 can be taken off the lead-out wires 232C and 232D of path H4 and, when the same predetermined current is applied to the lead-out wires 232C and 232D, the voltage V2 can be taken off the lead-out wires 232A and 232B of path H2. The Hall Effect sensors PHA and PHB can thus measure four voltages, V1 through V4, induced by an external magnetic field in much the same way as the four coil system of the AC probe mentioned earlier.

For sensor PHA the lead-out wires 231A and 231B of path H1 are connected to internal switches S1, S2 and S5, S6, respectively, of analog switch 40A, while the lead-out wires 231C and 231D of path H3 are connected to internal switches S3, S4 and S7, S8, respectively, of analog switch 40A. The other ends of the switches S1, S3, S5 and S7 are connected to the voltage amplifier 41A (FIG. 11 or FIG. 12), while the other ends of the switches S2, S4, S6 and S8 are connected to the constant current source 50 (FIG. 23). During operation, the switches S1 and S3 will apply either of the voltages V1 and V3 (of one of the two paths H1 or H3, respectively, from the front sensor PHA) to one element (via lines 231A or 231C; FIG. 23) of the voltage amplifier 41A while switches S5 and S7 will apply a ground signal (of one of the two paths H1 or H3, respectively, from the front sensor PHA) to another element (via lines 231B or 231D; FIG. 23) of the voltage amplifier 41A; said other element being the ground input thereof or a reference above ground. Switches S2 and S4 will connect the other path (or one of the two paths H1 or H3, respectively, from the front sensor PHA) to the positive element (via lines 231A or 231C; FIG. 23) of the constant current source 50 while switches S6 and S8 will connect the other path (of one of the two paths H1 or H3, respectively, from the front sensor PHA) to the ground element (via 231B or 231D; FIG. 23) of the constant current source 50. For voltage V1, it is the voltage potential between lead-out wires 231A and 231B which is applied to said two elements of the voltage amplifier 41A, while for voltage V3, it is the voltage potential between lead-out wires 231C and 231D that is so applied.

For sensor PHB the lead-out wires 232A and 232B of path H2 are connected to internal switches S9, S10 and S13, S14, respectively, of analog switch 40B, while the lead-out wires 231C and 231D of path H4 are connected to internal switches S11, S12 and S15, S16, respectively, of analog switch 40B. The other ends of the switches S9, S11, S13 and S15 are connected to the voltage amplifier 41B (FIG. 11 or FIG. 12), while the other ends of the switches S10, S12, S14 and S16 are connected to the constant current source 50 (FIG. 23). During operation, the switches S9 and S11 will apply either of the voltages V2 or V4 (of one of the two paths H2 or H4, respectively, from the front sensor PHB) to one element (via lines 232A or 232C; FIG. 23) of the voltage amplifier 41B while switches S13 and S15 will apply a ground signal (of one of the two paths H2 or H4, respectively, from the front sensor PHB) to another element (via lines 232B or 232D; FIG. 23) of the voltage amplifier 41B; said other element being the ground input thereof or a reference above ground. Switches S10 and S12 will connect the other path (of one of the two paths H2 or H4, respectively, from the rear sensor PHB) to the positive element (via lines 232A or 232C; FIG. 23) of the constant current source 50 while switches S14 and S16 will connect the other path (of one of the two paths H2 or H4, respectively, from the rear sensor PHB) to the ground element (via 232B or 232D; FIG. 23) of the constant current source 50. For voltage V2, it is the voltage potential between lead-out wires 232A and 232B which is applied to said two elements of the voltage amplifier 41B, while for voltage V4, it is the voltage potential between lead-out wires 232C and 232D that is so applied.

For determining angle orientation (theta "$\theta$"), the central processor 45 uses but one of the analog switches 40A (FIGS. 11, 12 and 23) or 40B (FIGS. 11, 12 and 23) at any one time. Analog switch 40A, when used, separately applies voltages V1 and V3 to the voltage amplifier 41A successively, while analog switch 40B, when used, separately applies voltages V2 and V4 to the voltage amplifier 41B successively. As previously explained, the ratio V1/V3 or V3/V1 or V2/V4 or V4/V2 is used to determine angle orientation theta "$\theta$".

For determining distance "w", the central processor 45 uses both analog switches 40A (FIGS. 11 or 12 and 23) and 40B (FIGS. 11 or 12 and 23) simultaneously. Together these two switches 40A and 40B, apply two voltages (the higher of V1 or V3 from the front sensor PHA and the higher of V2 or V4 from the rear sensor PHB) at the same time to the two voltage amplifiers 41A and 41B respectively. As previously explained, the ratio of (V1 or V3)/(V2 or V4) or (V2 or V4)/(V1 or V3), together with the distance "z", is used by the central processor 45 to determine distance "w".

For calculating the magnitude of the current "I" in the current-carrying conductor 233, the central processor 45 does not use either of the analog switches 40A or 40B, but rather calculates the value "I" from the higher of the voltages V1 or V3, the higher of the voltages V2 or V4, the already determined angle orientation (theta "$\theta$") and the already determined distance "w".

DESCRIPTION OF THE THEORY OF OPERATION OF THE DC PROBE

The radial angle alpha "$\alpha$" for the paths H1 and H3 and for the paths H2 and H4 is assumed to be 90 degrees as shown in FIGS. 21 and 22 for the DC probe. When the latter is placed near a current-carrying conductor 233, the front set of current conducting paths, H1 and H3, are disposed at two orientation angles (theta "$\theta 1$" and theta "$\theta 3$") as shown in FIG. 21 which shows the spacial relationship of the current-carrying conductor 233 and the front set of current conducting paths H1 and H3 (the rear set of current conductiing paths H2 and H4 are omitted for the purpose of clarity). Angles $\theta 1$ and $\theta 3$ in FIG. 21 are assumed as shown in Table C below:

TABLE C

| ANGLE | (FIG. 21) PATH | |
|---|---|---|
| $\theta 1$ | H1 | (90 degrees) |
| $\theta 3$ | H3 | (0 degrees) |

The rear set of current conducting paths, H2 and H4, will be disposed at two other orientation angles (theta "$\theta 2$" and theta "$\theta 4$") as shown in FIG. 22 which shows the spacial relationship of the current-carrying conductor 233 and the rear set of current conducting paths H2 and H4 (the front set current conducting paths H1 and H3 are ommitted for the purpose of clarity). Angles $\theta 2$ and $\theta 4$ in FIG. 22 are assumed as shown in Table D below:

TABLE D

| ANGLE | (FIG. 22) PATH | |
|---|---|---|
| $\theta 2$ | H2 | (45 degrees) |
| $\theta 4$ | H4 | (45 degrees) |

The magnetic field generated by the current-carrying conductor 233 will induce four different alternating voltages in the paths H1 through H4 which are designated V1 through V4, respectively. For each path the respective induced alternating voltage is determined by the following general equation:

$$V = \frac{J}{ne} \times B \quad (17)$$

or $$V = \frac{J}{ne} (\text{cross product}) B \quad (17A)$$

where;

"V" is the voltage potential induced across any one of the paths H1 through H4.

"J" is the known current density flowing into the Hall Effect sensor from the constant current source 50. It is a vector quantity in which the direction of the vector is the same as the direction of the flow of the current from the constant current source 50 in the Hall Effect sensor.

"n" is the known number of charge carriers (electrons) passing through the Hall Effect sensor from the constant current source 50.

"e" is a constant value representing the coulomb charge of an electron.

"B" is a vector quantity representing all those instantaneous values of the magnetic flux cutting the DC probe during the time same is sensing the current "I" in the current-carrying conductor 233. The direction of "B" is the same as that of the magnetic field produced by the current "I" in the current-carrying conductor 233.

"x" represents the conventional mathematical cross product symbol and constitutes the product of: (i) the vector quantity "B", (ii) the vector quantity "J/ne", and (iii) the sine of the angle theta "$\theta$" between their respective directions.

The magnetic field "B" generated by the current-carrying conductor 233 is also related to the current "I" in the current-carrying conductor 233 by the following equation:

$$B = uI/2\pi w \quad (18)$$

where;

"B" is as just defined.

"I" is the magnitude of the current in the current-carrying conductor 233.

"w" is as previously defined (i.e.; the distance of the plane of the front sensor PHA from the current-carrying conductor 233.

"$2\pi$" takes into consideration the radial effect of the magnetic field strength.

"u" is the permeability of the material inside of the front casing 234. When the front casing 234 is air-filled, "u" is assumed to be equal to that for air (u∘) at room temperature, as shown in equation (18) above.

Since the voltages of sensor PHA are V1 and V3, and the voltages of sensor PHB are V2 and V4, then the ratio of V1/V3 or V3/V1, on the one hand, or V2/V4 or V4/V2, on the other, will result in relationships of voltage and orientation angle as shown below. These voltage ratios enable me to obtain the values of the angle orientation (theta "$\theta$"). Having in mind the general equations (17) and (18), and the values of "B", and "J/ne" therein, for the ratio, for example of V1/V3, the instantaneous values cancel each other with the result of ending up with the ratio of the $\sin\theta/\cos\theta$ or $\tan\theta$ as shown below in equations (22) and (23) respectively:

$$\frac{V1}{V3} = \frac{(J/ne)B1\sin\theta 1}{(J/ne)B3\sin\theta 3} \quad (19)$$

$$\frac{V1}{V3} = \frac{\frac{J}{ne}\left(\frac{uI}{2\pi w}\right)\sin\theta 1}{\frac{J}{ne}\left(\frac{uI}{2\pi w}\right)\sin\theta 3} \quad (20)$$

Equation (20) can be reduced to a relationship of voltage and orientation angle as follows:

$$V1/V3 = \sin\theta 1 / \sin\theta 3 \quad (21)$$

$$V1/V3 = \sin\theta 1 / \cos\theta 1 \quad (22)$$

$$V1/V3 = \tan\theta 1 \quad (23)$$

where; $\theta 1$ is the angle which the path H1 makes with the current-carrying conductor 233 (See FIG. 21).

Similarly, the other volatage ratios produce the same ratio of $\sin\theta/\cos\theta$ or $\tan\theta$ as shown in the following equations for voltage ratios V1/V3, V4/V2, and V2/V4:

$$V3/V1 = \tan\theta 3 \quad (24)$$

where; $\theta 3$ is the angle which the path H3 makes with the current-carrying conductor 233 (See FIG. 21); and $$V2/V4 = \tan\theta 2 \quad (25)$$

where; $\theta 2$ is the angle which the path H2 makes with the current-carrying conductor 233 (See FIG. 22); and $$V4/V2 = \tan\theta 4 \quad (26)$$

where; $\theta 4$ is the angle which the path H4 makes with the current-carrying conductor 233 (See FIG. 22).

Thus, any one of the angles $\theta 1$, $\theta 3$, $\theta 2$, or $\theta 4$ (of the current-conducting paths H1 through H4) is determined from any one of the four voltage ratios as shown above and is the first unknown quantity to be revealed by my invention.

The other three orientation angles are immediately computed from the value of the one first determined since the radial angle delta "$\delta$" (FIG. 15) and the radial angle alpha "$\alpha$" (FIGS. 21 and 22) are fixed parameters determined by the particular hardware for that specific DC probe.

From the orientation angle of a path from the sensor PHA and the orientation angle of a path from the sensor PHB, the distance "w" is determined as follows.

One of the voltages V1 or V3 with its respective angle $\theta 1$ or $\theta 3$ and one of the voltages V2 or V4 with its respective angle $\theta 2$ or $\theta 4$ and the known distance "z" are used to calculate the unknown distance "w" (between the plane of the front sensor PHA and the conductor 233). In order to assure accuracy, the switching accomplished by the DC interface circuit of FIG. 23 is controlled by the central processor 45 to automatically utilize the higher of the two voltages from each of the sensors PHA and PHB. The central processor 45 is programmed to utilize the known current from the constant current source 50 "J/ne", the distance "z" (which is a fixed parameter determined by the particular hardware for the specific DC probe), the angles $\theta 1$, $\theta 3$, $\theta 2$, or $\theta 4$, and a ratio of the higher voltage from the front sensor PIA in respect to the higher voltage from the rear sensor PIB, (or vice versa) to calculate the value of the distance "w". Again, these voltage ratios enable me to obtain the value of the distance "w" using the following relationship:

$$w = f\left(\frac{V1 \text{ or } V3}{V2 \text{ or } V4}, \text{ and } z, \text{ and } \theta 1 \text{ or } \theta 3, \text{ and } \theta 2 \text{ or } \theta 4\right) \quad (27)$$

This distance "w" is the second and final unknown quantity to be revealed by my invention before the current "I" in the current-carrying conductor 233 is calculated.

Having in mind the general equations (17) and (18), and the values of "B" and "J/ne" therein, for the ratio, for example of (V1 or V3)/(V2 or V4), the instantaneous values cancel each other with the result of ending up with a relationship between "w" and "z" as shown below:

$$\frac{V1 \text{ or } V3}{V2 \text{ or } V4} = \frac{(J/ne)(B1 \text{ or } B3)\sin(\theta 1 \text{ or } \theta 3)}{(J/ne)(B2 \text{ or } B4)\sin(\theta 2 \text{ or } \theta 4)} \quad (28)$$

$$\frac{V1 \text{ or } V3}{V2 \text{ or } V4} = \frac{\frac{J}{ne}\left(\frac{uI}{2\pi w}\right)\sin(\theta 1 \text{ or } \theta 3)}{\frac{J}{ne}\left(\frac{uI}{2\pi(w+z)}\right)\sin(\theta 2 \text{ or } \theta 4)} \quad (29)$$

Equation (29) can be reduced to a simple function with just one unkonwn "w":

$$w = f\left(\frac{w}{w+z}\right) \tag{30}$$

Once the distance "w" is determined, it can be used to determine the magnetic flux "B" since "J/ne" and the instantaneous induced voltage "V" (i.e. V1, V3, V2, or V4) are known using the relationship derived from the general formula (16) and the following equations (31) and (31A).

$$J/ne \times B = V \tag{31}$$

or $$J/ne(\text{cross product})B = V \tag{31A}$$

The orientation angle theta "θ" is taken into consideration in equations (31) and (31A) from the use of the cross product "x" therein. The magnitude of the current "I" in the current-carrying conductor 233 can then be calculated from the magnetic flux "B" using the following equation derived from equation (15):

$$I = \frac{B 2\pi w}{u} \tag{32}$$

DESCRIPTION OF THE OPERATION OF TWO ALTERNATE PROCESSING CIRUITS

FIGS. 11 and 12 show two alternate processing circuits that may be used with either the AC or DC probe described.

Referring first to the processing circuit shown in FIG. 11, for the AC probe, the four voltages, V1 through V4, taken off the coils C1 through C4 are applied to the interface circuit of FIG. 13 which includes the two analog switches 40A and 40B (FIG. 11) as described. From the AC interface circuit (FIG. 13), the two voltages, either V1 or V3, and either V2 or V4, are applied to the processing circuit (FIG. 11) which contains the mentioned voltage amplifiers 41A and 41B as described.

For the DC probe, the four voltages V1 through V4, taken off the current-conducting paths H1 through H4 are applied to the interface circuit of FIG. 23 which includes the same two analog switches 40A and 40B (FIG. 11) as described. From the DC interface circuit (FIG. 23), the two voltages, either V1 or V3, and either V2 or V4, are applied to the processing circuit (FIG. 11) which contains the mentioned voltage amplifiers 41A and 41B as described.

In the processing circuit of FIG. 11, the outputs of the voltage amplifiers 41A and 41B are either boosted or bucked by gain control devices 49A and 49B, respectively, to compensate for signals which are either too weak or too strong. The gain control devices 49A and 49B, in turn, are controlled by a digital feedback signal from the central processor 45. Once amplified, the two voltage signals from the voltage amplifiers 41A and 41B are then applied to respective peak detectors 41A and 42B which convert alternating voltage signals to variable DC voltage signals having peak magnitude significance. The latter signals are then converted to digital or binary signals by the analog to digital convertors 43A and 43B, respectively, and are then sent to respective parallel input ports 44A and 44B which gates inputs to the central processor 45. The central processor 45 has a memory 46 for storing data which it calculates (such as the values for coil angle orientation theta "θ"; the value for the probe distance "w"; and the value of the current magnitude "I" in the current-carrying conductor 33) or which is originally fed thereinto (such as coil voltages V1, V3 from the front sensor PIA; V2, V4 from the rear sensor PIB; the value for the radial separation angle alpha "α" of the pair of coils C1 and C3 or the pair of coils C2 and C4; the value for the radial separation angle delta "δ" of the front and rear sensors PIA and PIB; and the value for the axial separation distance "z" between the front and rear sensors PIA and PIB). The output of the central processor 45 is a suitable digital display 47 from which can be read digital readouts of any one or more of the following values: voltages V1 through V4; angle theta "θ"; distance "w"; or the magnitude of the current "I". The processing circuit of FIG. 11 makes a digital display of the current magnitude of the current "I" in the current-carrying conductor (33 in the case of the AC probe and 233 in the case of the DC probe) and also makes a digital display of the the angle orientation theta "θ", the distance "w", and of the voltages V1, V3, V2, and V4.

The other processing circuit shown in FIG. 12 provides a visual display of the current "I" in the current-carrying conductor. In the case of the AC this display will be of the waveform and, in the case of the DC probe, the steady condition shown at different current magnitudes. The elements in the processing circuit of FIG. 12 which are common to those in FIG. 11 bear the same reference numbers. The circuit of FIG. 12 is the same as that of FIG. 11 with two exceptions. The circuit of FIG. 12 eliminates the peak detectors 42A and 42B and has a visual display 48 (which may be a cathode ray tube), rather than a digital display. If desired, in the case of the AC probe, the waveforms of the voltages V1 through V4, as they are being received, can also be visually displayed by the visual display 48. In the case of the DC probe, the steady state condition of the voltages V1 through V4 at different voltage magnitudes can also be visually displayed by the visual display 48. Likewise, the magnitude of the angle theta "θ" can be visually displayed by the visual display 48 in either case (of the AC or DC probe).

In each of FIGS. 11 and 12 the block diagram elements are shown interconnected by a single line for simplicity of illustration. In actuality, there can be any number of electrical lines as required.

To assure proper measurement, the AC signal should not exceed an upper limit of frequency as determined by the clock speed for the central processor 45. The clock speeds for the A/D convertors 43A and 43B must be high enough so that proper sampling of the AC signal can be achieved.

What I claim is:

1. A leadless current-sensing device for sensing current flowing in a current carrying conductor when said device is positioned in the vicinity of said current-carrying conductor comprising:
   (a) a set of two current sensors disposed at a preset radial angle alpha "α" in respect to each other;
   (b) a pair of lead-out wires on each current sensor providing a voltage potential thereacross corresponding to the voltage induced in the respective current sensor by the magnetic field surrounding said current-carrying conductor;

(c) said set of current sensors having a sampling point capable of sampling distinct voltage potentials induced in the two current sensors; and (d) means including a voltage processing circuit for comparing said two voltage potentials from said current sensors to each other to calculate the orientation angle (theta "$\theta$") that each current sensor makes with the current-carrying conductor.

2. A leadless current-sensing device for sensing current flowing in a current carrying conductor when said device is positioned in the vicinity of said current-carrying conductor comprising:

(a) a probe having a first set of two current sensors disposed at a preset radial angle alpha "$\alpha$" in respect to each other;

(b) a pair of lead-out wires on each current sensor providing a voltage potential thereacross corresponding to the voltage induced in the respective current sensor by the magnetic field surrounding said current-carrying conductor;

(c) said probe also having a second set of two current sensors disposed at a preset radial angle alpha "$\alpha$" in respect to each other;

(d) a pair of lead-out wires on each current sensor of said second set of current sensors providing a voltage potential thereacross corresponding to the voltage induced in the respective current sensor by the magnetic field surrounding said current-carrying conductor;

(e) said first set of current sensors having a sampling point capable of sampling distinct voltage potentials induced in the two current sensors of said first set of current sensors;

(f) said second set of current sensors having a sampling point capable of sampling distinct voltage potentials induced in the two current sensors of said second set of current sensors;

(g) the first and second sets of current sensors being disposed at a preset radial angle delta "$\delta$" in respect to each other;

(h) the first and second sets of current sensors being disposed so that corresponding sampling points thereof are at a preset axial distance "z" in respect to each other; and (i) means including a voltage processing circuit for comparing to each other two voltage potentials from either said set of current sensors to calculate the orientation angle (theta "$\theta$") that each sensor makes with the current-carrying conductor.

3. A leadless current-sensing device as claimed in claim 2 in which said voltage processing circuit includes:

(a) means for comparing the greater voltage potential from said first set of two current sensors to the greater voltage potential from said second set of two current sensors to calculate a voltage ratio between them; and (b) means using said calculated voltage ratio, an orientation angle (theta "$\theta$"), and said axial distance "z" to calculate the linear distance "w" of said probe from said current-carrying conductor.

4. A leadless current-sensing device as claimed in claim 3 in which said voltage processing circuit includes:

(a) means using any one of four voltage potentials, an orientation angle (theta "$\theta$"), and said linear distance "w" to calculate the magnitude "I" of the current flowing in said current-carrying conductor.

5. A leadless current-sensing device for sensing current flowing in a current carrying conductor when said device is positioned in the vicinity of said current-carrying conductor comprising:

(a) a probe having a first set of two current sensors disposed at a preset radial angle alpha "$\alpha$" in respect to each other;

(b) a pair of lead-out wires on each current sensor providing a voltage potential thereacross corresponding to the voltage induced in the respective current sensor by the magnetic field surrounding said current-carrying conductor;

(c) said probe also having a second set of two current sensors disposed at a preset radial angle alpha "$\alpha$" in respect to each other;

(d) a pair of lead-out wires on each current sensor of said second set of current sensors providing a voltage potential thereacross corresponding to the voltage induced in the respective current sensor by the magnetic field surrounding said current-carrying conductor;

(e) said first set of current sensors having a sampling point capable of sampling distinct voltage potentials induced in the two current sensors of said first set of current sensors;

(f) said second set of current sensors having a sampling point capable of sampling distinct voltage potentials induced in the two current sensors of said second set of current sensors;

(g) the first and second sets of current sensors being disposed at a preset radial angle delta "$\delta$" in respect to each other;

(h) the first and second sets of current sensors being disposed so that corresponding sampling points thereof are at a preset axial distance "z" in respect to each other;

(i) means including a voltage processing circuit for comparing to each other two voltage potentials from either said set of current sensors to calculate the orientation angle (theta "$\theta$") that each sensor makes with the current-carrying conductor;

(j) said voltage processing circuit including means for comparing the greater voltage potential from said first set of two current sensors to the greater voltage potential from said second set of two current sensors to calculate a voltage ratio between them;

(k) said voltage processing circuit including means for using said calculated voltage ratio, an orientation angle (theta "$\theta$"), and said axial distance "z" to calculate the linear distance "w" of said probe from said current-carrying conductor; and (l) said voltage processing circuit including means for using any one of four voltage potentials, an orientation angle (theta "$\theta$"), and said linear distance "w" to calculate the magnitude "I" of the current flowing in said current-carrying conductor.

6. A leadless current-sensing device as claimed in claim 5 further including:

(a) a protective non-metallic casing for housing said first and second sets of current sensors; and (b) means attached to said non-metallic casing for anchoring said first and second sets of current sensors therein to dispose them: (i) at said preset radial angle delta "$\delta$"; and (ii) at said preset axial distance "z".

7. A leadless current-sensing device as claimed in claim 6 further including:
   (a) a protective metallic casing for housing the four pairs of lead-out wires from said first and second sets of current sensors.

8. A leadless current-sensing device as claimed in claim 5 further including an interface circuit for handling the four voltage potentials from said current-sensing device and inputing them into said voltage processing circuit, said interface circuit comprising:
   (a) switching means corresponding to said first and second sets of current sensors for handling the four voltage potentials therefrom and providing two separate input paths for said voltage processing circuit.

9. A leadless current-sensing device for sensing AC current flowing in a current carrying conductor when said device is positioned in the vicinity of said current-carrying conductor comprising:
   (a) a set of two wire-wound coils constructed to intersect each other at opposite ends thereof and having their respective planes disposed at a preset radial angle alpha "$\alpha$" in respect to each other;
   (b) a pair of lead-out wires on each coil providing a voltage potential thereacross corresponding to the voltage induced in the respective coil by the magnetic field surrounding said current-carrying conductor;
   (c) said coil set having a sampling point at an end thereof corresponding to where the two coils of said coil set intersect each other;
   (d) said sampling point being capable of sampling distinct voltage potentials induced in the two coils of said coil set; and
   (e) means including a voltage processing circuit for comparing said two voltage potentials from said coil set to each other to calculate the orientation angle (theta "$\theta$") that the plane of each coil makes with the current-carrying conductor.

10. A leadless current-sensing device for sensing AC current flowing in a current carrying conductor when said device is positioned in the vicinity of said current-carrying conductor comprising:
   (a) a probe having a first set of two wire-wound coils constructed to intersect each other at opposite ends thereof and having their respective planes disposed at a preset radial angle alpha "$\alpha$" in respect to each other;
   (b) a pair of lead-out wires on each coil providing a voltage potential thereacross corresponding to the voltage induced in the respective coil by the magnetic field surrounding said current-carrying conductor;
   (c) said probe also having a second set of two wire-wound coils constructed to intersect each other at opposite ends thereof and having their respective planes disposed at a preset radial angle alpha "$\alpha$" in respect to each other;
   (d) a pair of lead-out wires on each coil of said second coil set providing a voltage potential thereacrosss corresponding to the voltage induced in the respective coil by the magnetic field surrounding said current-carrying conductor;
   (e) said first coil set having a sampling point at an end thereof corresponding to where the two coils of said first coil set intersect each other;
   (f) said sampling point of said first coil set being capable of sampling distinct voltage potentials induced in the two coils of said first coil set;
   (g) said second coil set having a sampling point at an end thereof corresponding to where the two coils of said first coil set intersect each other;
   (h) said sampling point of said second coil set being capable of sampling distinct voltage potentials induced in the two coils of said second coil set;
   (i) the first and second coil sets being disposed at a preset radial angle delta "$\delta$" in respect to each other;
   (j) the first and second coil sets being disposed so that corresponding sampling points thereof are at a preset axial distance "z" in respect to each other; and
   (k) means including a voltage processing circuit for comparing to each other two voltage potentials from either coil set to calculate the orientation angle (theta "$\theta$") that the plane of each respective coil makes with the current-carrying conductor.

11. A leadless current-sensing device as claimed in claim 10 in which said voltage processing circuit includes:
   (a) means for comparing the greater voltage potential from said first coil set to the greater voltage potential from said second coil set to calculate a voltage ratio between them; and
   (b) means using said calculated voltage ratio, an orientation angle (theta "$\theta$"), and said axial distance "z" to calculate the linear distance "w" of said probe from said current-carrying conductor.

12. A leadless current-sensing device as claimed in claim 11 in which said voltage processing circuit includes:
   (a) means using any one of four voltage potentials, an orientation angle (theta "$\theta$"), and said linear distance "w" to calculate the magnitude "I" of the AC current flowing in said current-carrying conductor.

13. A leadless current-sensing device for sensing AC current flowing in a current carrying conductor when said device is positioned in the vicinity of said current-carrying conductor comprising:
   (a) a probe having a first set of two wire-wound coils constructed to intersect each other at opposite ends thereof and having their respective planes disposed at a preset radial angle alpha "$\alpha$" in respect to each other;
   (b) a pair of lead-out wires on each coil providing a voltage potential thereacross corresponding to the voltage induced in the respective coil by the magnetic field surrounding said current-carrying conductor;
   (c) said probe also having a second set of two wire-wound coils constructed to intersect each other at opposite ends thereof and having their respective planes disposed at a preset radial angle alpha "$\alpha$" in respect to each other;
   (d) a pair of lead-out wires on each coil of said second coil set providing a voltage potential thereacross corresponding to the voltage induced in the respective coil by the magnetic field surrounding said current-carrying conductor;
   (e) said first coil set having a sampling point at an end thereof corresponding to where the two coils of said first coil set intersect each other;

(f) said sampling point of said first coil set being capable of sampling distinct voltage potentials induced in the two coils of said first coil set;

(g) said second coil set having a sampling point at an end thereof corresponding to where the two coils of said first coil set intersect each other;

(h) said sampling point of said second coil set being capable of sampling distinct voltage potentials induced in the two coils of said second coil set;

(i) the first and second coil sets being disposed at a preset radial angle delta "δ" in respect to each other;

(j) the first and second coil sets being disposed so that corresponding sampling points thereof are at a preset axial distance "z" in respect to each other;

(k) means including a voltage processing circuit for comparing to each other two voltage potentials from either coil set to calculate the orientation angle (theta "θ") that the plane of each respective coil makes with the current-carrying conductor;

(l) said voltage processing circuit including means for comparing the greater voltage potential from said first coil set to the greater voltage potential from said second coil set to calculate a voltage ratio between them;

(m) said voltage processing circuit including means for using said calculated voltage ratio, an orientation angle (theta "θ"), and said axial distance "z" to calculate the linear distance "w" of said probe from said current-carrying conductor; and (n) said voltage processing circuit including means for using any one of four voltage potentials, an orientation angle (theta "θ"), and said linear distance "w" to calculate the magnitude "I" of the AC current flowing in said current-carrying conductor.

14. A leadless current-sensing device as claimed in claim 13 further including:

(a) a protective non-metallic casing for housing said first and second coil sets; and (b) means attached to said non-metallic casing for anchoring said first and second coil sets therein to dispose them: (i) at said preset radial angle delta "δ"; and (ii) at said preset axial distance "z".

15. A leadless current-sensing device as claimed in claim 14 further including:

(a) a protective metallic casing for housing the four pairs of lead-out wires from said first and second coil sets.

16. A leadless current-sensing device as claimed in claim 13 further including an interface circuit for handling the four voltage potentials from said current-sensing device and inputing them into said voltage processing circuit, said interface circuit comprising:

(a) a pair of analog switches corresponding to said first and second coil sets for handling the four voltage potentials therefrom and providing two separate input paths for said voltage processing circuit.

17. A leadless current-sensing device for sensing DC current flowing in a current carrying conductor when said device is positioned in the vicinity of said current-carrying conductor comprising:

(a) a Hall Effect plate having two intersecting current-sensing paths therein and disposed at a preset radial angle alpha "δ" in respect to each other;

(b) a pair of lead-out wires from each current-sensing path providing a voltage potential thereacross corresponding to the voltage induced in the respective current-sensing path by the magnetic field surrounding said current-carrying conductor;

(c) said Hall Effect plate having a sampling point corresponding to where the two current-sensing paths of said Hall Effect plate intersect each other;

(d) said sampling point being capable of sampling distinct voltage potentials induced in the two current-sensing paths of said Hall Effect plate; and (e) means including a voltage processing circuit for comparing said two voltage potentials from said Hall Effect plate to each other to calculate the orientation angle (theta "θ") that each current-sensing path makes with the current-carrying conductor.

18. A leadless current-sensing device for sensing DC current flowing in a current carrying conductor when said device is positioned in the vicinity of said current-carrying conductor comprising:

(a) a probe having a first Hall Effect plate having two intersecting current-sensing paths disposed at a preset radial angle alpha "α" in respect to each other;

(b) a pair of lead-out wires from each current-sensing path providing a voltage potential thereacross corresponding to the voltage induced in the respective current-sensing path by the magnetic field surrounding said current-carrying conductor;

(c) said probe also having a second Hall Effect plate having two intersecting current-sensing paths disposed at a preset radial angle alpha "α" in respect to each other;

(d) a pair of lead-out wires from each current-sensing path of said second Hall Effect plate providing a voltage potential thereacross corresponding to the voltage induced in the respective current-sensing path by the magnetic field surrounding said current-carrying conductor;

(e) said first Hall Effect plate having a sampling point corresponding to where the two current-sensing paths thereof intersect each other;

(f) said sampling point of said first Hall Effect plate being capable of sampling distinct voltage potentials induced in the two current-sensing paths of said first Hall Effect plate;

(g) said second Hall Effect plate having a sampling point corresponding to where the two current-sensing paths thereof intersect each other;

(h) said sampling point of said second Hall Effect plate being capable of sampling distinct voltage potentials induced in the two current-sensing paths of said second Hall Effect plate;

(i) the first and second Hall Effect plates being disposed at a preset radial angle delta "δ" in respect to each other;

(j) the first and second Hall Effect plates being disposed at a preset axial distance "z" in respect to each other; and (k) means including a voltage processing circuit for comparing to each other two voltage potentials from either Hall Effect plate to calculate the orientation angle (theta "θ") that each respective current-sensing path makes with the current-carrying conductor.

19. A leadless current-sensing device as claimed in claim 18 in which said voltage processing circuit includes:

(a) means for comparing the greater voltage potential from said first Hall Effect plate to the greater voltage potential from said second Hall Effect plate to calculate a voltage ratio between them; and (b) means using said calculated voltage ratio, in orientation angle (theta "$\theta$"), and said axial distance "z" to calculate the linear distance "w" of said probe from said current-carrying conductor.

20. A leadless current-sensing device as claimed in claim 19 in which said voltage processing circuit includes:

(a) means using any one of four voltage potentials, an orientation angle (theta "$\theta$"), and said linear distance "w" to calculate the magnitude "I" of the DC current flowing in said current-carrying conductor.

21. A leadless current-sensing device for sensing DC current flowing in a current carrying conductor when said device is positioned in the vicinity of said current-carrying conductor comprising:

(a) a probe having a first Hall Effect plate having two intersecting current-sensing paths disposed at a preset radial angle alpha "$\alpha$" in respect to each other;

(b) a pair of lead-out wires from each current-sensing path providing a voltage potential thereacross corresponding to the voltage induced in the respective current-sensing path by the magnetic field surrounding said current-carrying conductor;

(c) said probe also having a second Hall Effect plate having two intersecting current-sensing paths disposed at a preset radial angle alpha "$\alpha$" in respect to each other;

(d) a pair of lead-out wires from each current-sensing path of said second Hall Effect plate providing a voltage potential thereacross corresponding to the voltage induced in the respective current-sensing path by the magnetic field surrounding said current-carrying conductor;

(e) said first Hall Effect plate having a sampling point corresponding to where the two current-sensing paths thereof intersect each other;

(f) said sampling point of said first Hall Effect plate being capable of sampling distinct voltage potentials induced in the two current-sensing paths of said first Hall Effect plate;

(g) said second Hall Effect plate having a sampling point corresponding to where the two current-sensing paths thereof intersect each other;

(h) said sampling point of said second Hall Effect plate being capable of sampling distinct voltage potentials induced in the two current-sensing paths of said second Hall Effect plate;

(i) the first and second Hall Effect plates being disposed at a preset radial angle delta "$\delta$" in respect to each other;

(j) the first and second Hall Effect plates being disposed at a preset axial distance "z" in respect to each other;

(k) means including a voltage processing circuit for comparing to each other two voltage potentials from either Hall Effect plate to calculate the orientation angle (theta "$\theta$") that each respective current-sensing path makes with the current-carrying conductor;

(l) said voltage processing circuit including means for comparing the greater voltage potential from said first Hall Effect plate to the greater voltage potential from said second Hall Effect plate to calculate a voltage ratio between them;

(m) said voltage processing circuit including means for using said calculated voltage ratio, an orientation angle (theta "$\theta$"), and said axial distance "z" to calculate the linear distance "w" of said probe from said current-carrying conductor; and (n) said voltage processing circuit including means for using any one of four voltage potentials, an orientation angle (theta "$\theta$"), and said linear distance "w" to calculate the magnitude "I" of the DC current flowing in said current-carrying conductor.

22. A leadless current-sensing device as claimed in claim 21 further including:

(a) a protective non-metallic casing for housing said first and second Hall Effect plates; and (b) means attached to said non-metallic casing for anchoring said first and second Hall Effect plates therein to dispose them: (i) at said preset radial angle delta "$\delta$"; and (ii) at said preset axial distance "z".

23. A leadless current-sensing device as claimed in claim 22 further including:

(a) a protective metallic casing for housing the four pairs of lead-out wires from said first and second Hall Effect plates.

24. A leadless current-sensing device as claimed in claim 21 further including an interface circuit for handling the four voltage potentials from said current-sensing device and inputing them into said voltage processing circuit, said interface circuit comprising:

(a) a pair of analog switches corresponding to said first and second Hall Effect plates for handling the four voltage potentials therefrom and providing two separate input paths for said voltage processing circuit; and (b) a constant-current source injecting a known current into one of the current-sensing paths of each Hall Effect plate while the other current-sensing path thereof senses the magnetic field emanating from the current-carrying conductor.

25. A method of leadless current-sensing for sensing current flowing in a current carrying conductor comprising:

(a) providing a set of two current sensors disposed at a preset radial angle alpha "$\alpha$" in respect to each other;

(b) providing a pair of lead-out wires on each current sensor to produce a voltage potential thereacross corresponding to the voltage induced in the respective current sensor by the magnetic field surrounding said current-carrying conductor;

(c) said set of current sensors having a sampling point capable of sampling distinct voltage potentials induced in the two current sensors when said set of two current sensors are positioned in the vicinity of said current-carrying conductor; and (d) comparing said two voltage potentials from said current sensors to each other to calculate the orientation angle (theta "$\theta$") that each current sensor makes with the current-carrying conductor.

26. A method of leadless current-sensing for sensing current flowing in a current carrying conductor comprising:

(a) providing a probe with a first set of two current sensors disposed at a preset radial angle alpha "$\alpha$" in respect to each other;

(b) providing a pair of lead-out wires on each current sensor to produce a voltage potential thereacross corresponding to the voltage induced in the respective current sensor by the magnetic field surrounding said current-carrying conductor;

(c) providing said probe also with a second set of two current sensors disposed at a preset radial angle alpha "$\alpha$" in respect to each other;

(d) providing a pair of lead-out wires on each current sensor of said second set of current sensors to produce a voltage potential thereacross corresponding to the voltage induced in the respective current sensor by the magnetic field surrounding said current-carrying conductor;

(e) each set of current sensors having a sampling point capable of sampling distinct voltage potentials induced in the two current sensors thereof when either set of two current sensors are positioned in the vicinity of said current-carrying conductor;

(f) disposing the first and second sets of current sensors at a preset radial angle delta "$\delta$" in respect to each other;

(g) disposing the first and second sets of current sensors so that corresponding sampling points thereof are at a preset axial distance "z" in respect to each other; and (h) comparing to each other two voltage potentials from either said set of current sensors to calculate the orientation angle (theta "$\theta$") that each sensor makes with the current-carrying conductor.

27. A method of leadless current-sensing as claimed in claim 26 further comprising:

(a) comparing the greater voltage potential from said first set of two current sensors to the greater voltage from said second set of two current sensors to calculate a voltage ratio between them; and (b) using said calculated voltage ratio, an orientation angle (theta "$\theta$"), and said axial distance "z" to calculate the linear distance "w" of said current-sensing device from said current-carrying conductor.

28. A method of leadless current-sensing as claimed in claim 27 further comprising:

(a) using any one of four voltages, an angle orientation (theta "$\theta$"), and said distance "w" to calculate the magnitude "I" of the current flowing in said current-carrying conductor.

29. A method of leadless current-sensing for sensing current flowing in a current carrying conductor comprising:

(a) providing a probe with a first set of two current sensors disposed at a preset radial angle alpha "$\alpha$" in respect to each other;

(b) providing a pair of lead-out wires on each current sensor to produce a voltage potential thereacross corresponding to the voltage induced in the respective current sensor by the magnetic field surrounding said current-carrying conductor;

(c) providing said probe also with a second set of two current sensors disposed at a preset radial angle alpha "$\alpha$" in respect to each other;

(d) providing a pair of lead-out wires on each current sensor of said second set of current sensors to produce a voltage potential thereacross corresponding to the voltage induced in the respective current sensor by the magnetic field surrounding said current-carrying conductor;

(e) each set of current sensors having a sampling point capable of sampling distinct voltage potentials induced in the two current sensors thereof when either set of two current sensors are positioned in the vicinity of said current-carrying conductor;

(f) disposing the first and second sets of current sensors at a preset radial angle delta "$\delta$" in respect to each other;

(g) disposing the first and second sets of current sensors so that corresponding sampling points thereof are at a preset axial distance "z" in respect to each other;

(h) comparing to each other two voltage potentials from either said set of current sensors to calculate the orientation angle (theta "$\theta$") that each sensor makes with the current-carrying conductor;

(i) comparing the greater voltage potential from said first set of two current sensors to the greater voltage from said second set of two current sensors to calculate a voltage ratio between them;

(j) using said calculated voltage ratio, an orientation angle (theta "$\theta$"), and said axial distance "z" to calculate the linear distance "w" of said current-sensing device from said current-carrying conductor; and (k) using any one of four voltages, an orientation angle (theta "$\theta$"), and said distance "w" to calculate the magnitude "I" of the current flowing in said current-carrying conductor.

30. A method of leadless current-sensing as claimed in claim 29 further comprising:

(a) handling the four voltage potentials from said current sensors by appropriate switching to provide two separate input paths for further voltage processing of said voltage potentials.

* * * * *